(12) United States Patent  
Booth, Jr. et al.

(10) Patent No.: US 8,492,811 B2
(45) Date of Patent: Jul. 23, 2013

(54) SELF-ALIGNED STRAP FOR EMBEDDED CAPACITOR AND REPLACEMENT GATE DEVICES

(75) Inventors: Roger A. Booth, Jr., Wappingers Falls, NY (US); Kangguo Cheng, Guilderland, NY (US); Joseph Ervin, Hopewell Junction, NY (US); Chengwen Pei, Danbury, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 12/886,224

(22) Filed: Sep. 20, 2010

(65) Prior Publication Data

US 2012/0068237 A1    Mar. 22, 2012

(51) Int. Cl.
*H01L 27/108* (2006.01)

(52) U.S. Cl.
USPC ............... 257/296; 257/304; 257/E27.084

(58) Field of Classification Search
USPC .................... 257/304, 296, E27.084
See application file for complete search history.

(56) References Cited

U.S. PATENT DOCUMENTS

| | | | |
|---|---|---|---|
| 5,670,805 A | | 9/1997 | Hammerl et al. |
| 6,066,526 A | * | 5/2000 | Hakey et al. ............... 438/243 |
| 6,249,017 B1 | * | 6/2001 | Togo ............................. 257/301 |
| 6,410,399 B1 | | 6/2002 | Flaitz et al. |
| 6,521,938 B2 | * | 2/2003 | Hamamoto ................. 257/304 |
| 7,153,737 B2 | | 12/2006 | Kwon et al. |
| 7,271,023 B2 | | 9/2007 | Lee et al. |
| 7,625,811 B2 | | 12/2009 | Barbe et al. |
| 2003/0003651 A1 | * | 1/2003 | Divakaruni et al. ........ 438/243 |
| 2009/0170295 A1 | | 7/2009 | Vincent et al. |
| 2009/0184392 A1 | | 7/2009 | Cheng et al. |
| 2010/0102373 A1 | | 4/2010 | Li et al. |

OTHER PUBLICATIONS

Feng, J. et al., "Integration of Germanium-on-Insulator and Silicon MOSFETs on a Silicon Substrate" IEEE Electron Device Letters (2006) pp. 911-913, vol. 27(11).

Liu, Y. et al., "Rapid Melt Growth of Germanium Crystals with Self-Aligned Microcrucibles on Si Substrates" Journal of the Electrochemical Society (2005) pp. G688-G693, vol. 152(8).

* cited by examiner

*Primary Examiner* — Lex Malsawma
(74) *Attorney, Agent, or Firm* — Scully, Scott, Murphy & Presser, P.C.; Joseph P. Abate, Esq.

(57) ABSTRACT

After forming a planarization dielectric layer in a replacement gate integration scheme, disposable gate structures are removed and a stack of a gate dielectric layer and a gate electrode layer is formed within recessed gate regions. Each gate electrode structure is then recessed below a topmost surface of the gate dielectric layer. A dielectric metal oxide portion is formed above each gate electrode by planarization. The dielectric metal oxide portions and gate spacers are employed as a self-aligning etch mask in combination with a patterned photoresist to expose and metalize semiconductor surfaces of a source region and an inner electrode in each embedded memory cell structure. The metalized semiconductor portions form metal semiconductor alloy straps that provide a conductive path between the inner electrode of a capacitor and the source of an access transistor.

20 Claims, 19 Drawing Sheets

SELF-ALIGNED STRAP FOR EMBEDDED CAPACITOR AND REPLACEMENT GATE DEVICES

BACKGROUND

The present disclosure relates to a semiconductor structure, and particularly to a semiconductor structure including replacement gate devices and an embedded capacitor having a self-aligned metal semiconductor alloy strap, and methods of manufacturing the same.

Deep trench capacitors are used in a variety of semiconductor chips for high areal capacitance and low device leakage. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Semiconductor-on-insulator (SOI) devices formed on an SOI substrate or on a hybrid substrate provide high performance in advanced semiconductor chips. In SOI devices, the capacitive coupling between a substrate and semiconductor devices is reduced by the presence of a buried insulator layer. By forming a deep trench capacitor in the SOI substrate, SOI logic devices such as SOI transistors and deep trench capacitors may be formed on the same SOI substrate, thereby enabling embedding of deep trench capacitors into the SOI substrate that also contain high performance SOI logic devices.

Deep trench capacitors are typically electrically connected to an access transistor through a conductive structure, which is referred to as a "strap" or a "conductive strap" in the art. The strap is necessary because electrical current must pass between the access transistor and the inside of the deep trench in order to store electrical charges in the deep trench capacitor or to read the electrical charges stored in the deep trench capacitor. Because a node dielectric in the deep trench is initially formed on the entire inner surfaces of the deep trench, however, prior art methods for forming a deep trench capacitor employ recess etches to remove portions of the node dielectric, followed by the deposition of a conductive material inside the recessed volume to form a buried strap. These processing steps are costly and time consuming, and consequently, embedding of deep trench capacitors increases manufacturing cost and processing time due to the additional processes employed to form the strap.

BRIEF SUMMARY

After forming a planarization dielectric layer in a replacement gate integration scheme, disposable gate structures are removed and a stack of a gate dielectric layer and a gate electrode layer is formed within recessed gate regions. Each gate electrode structure is then recessed below a topmost surface of the gate dielectric layer. A dielectric metal oxide portion is formed above each gate electrode by planarization. The dielectric metal oxide portions and dielectric gate spacers are employed as a self-aligning etch mask in combination with a patterned photoresist to expose and metalize semiconductor surfaces of a source region and an inner electrode in each embedded memory cell structure. The metalized semiconductor portions form metal semiconductor alloy straps that provide a conductive path between the inner electrode of a capacitor and the source of an access transistor. In one embodiment, the planarization dielectric layer is not removed outside the regions of the capacitors and the source side of access transistors. Additional metal semiconductor alloys for other replacement gate devices are formed in a subsequent step after depositing a contact via level dielectric material layer and forming via holes therein. In another embodiment, all of the planarization dielectric layer is removed to expose all regions in which metal semiconductor alloys are to be formed, and all metal semiconductor alloy portions are formed simultaneously.

According to an aspect of the present disclosure, a semiconductor structure includes: a trench located in a semiconductor substrate; a node dielectric located on a sidewall of the trench; an inner electrode including a first doped semiconductor material and located within the node dielectric; an access transistor located on the semiconductor substrate and including an access transistor source region including a second doped semiconductor material and contacting the node dielectric; and a metal semiconductor alloy portion contacting the inner electrode, the node dielectric, and the access transistor source region.

According to another aspect of the present disclosure, a method of forming a semiconductor structure is provided. The method includes: forming a trench in a semiconductor substrate; forming a node dielectric on a sidewall of the trench; forming an inner electrode including a first doped semiconductor material within the node dielectric; forming an access transistor on the semiconductor substrate, wherein the access transistor includes an access transistor source region including a second doped semiconductor material and contacting the node dielectric; and forming a metal semiconductor alloy portion contacting the inner electrode, the node dielectric, and the access transistor source region.

DETAILED DESCRIPTION

Figure 1:
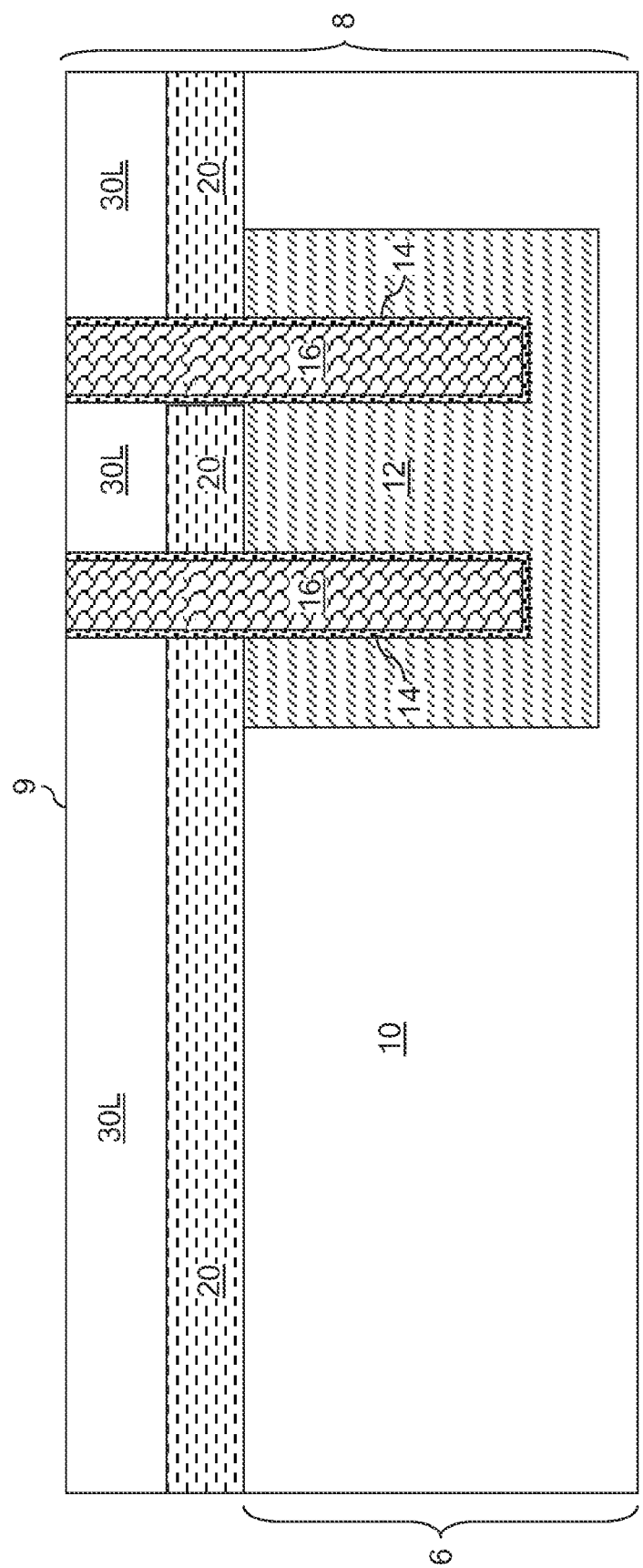
FIG. 1 is a vertical cross-sectional view of a first exemplary semiconductor structure after formation of deep trenches, node dielectrics, and inner electrodes according to a first embodiment of the present disclosure.

As stated above, the present disclosure relates to a semiconductor structure including replacement gate devices and an embedded capacitor having a self-aligned metal semiconductor alloy strap, and methods of manufacturing the same, which are now described in detail with accompanying figures. It is noted that like reference numerals refer to like elements across different embodiments.

Referring to FIG. 1, a first exemplary semiconductor structure according to a first embodiment of the present disclosure includes a semiconductor substrate 8, in which deep trench capacitors are formed. The semiconductor substrate 8 can be a semiconductor-on-insulator (SOI) substrate containing a top semiconductor layer 30L, a buried insulator layer 20, and a bottom semiconductor layer 6 located under the buried insulator layer 20. Each of the top semiconductor layer 30L and the bottom semiconductor layer 6 includes a semiconductor material. The semiconductor material of the top semiconductor layer 30L and the semiconductor material of the bottom semiconductor layer 6 may be the same, or different. The semiconductor material for the top semiconductor layer 30L and the bottom semiconductor layer 6 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon.

In one embodiment, the top semiconductor layer 30L includes a single crystalline material having an epitaxial alignment throughout the entirety of the top semiconductor layer 30L. However, embodiments in which the top semiconductor layer 30L and/or the bottom semiconductor layer 6 include at least one polycrystalline or amorphous semiconductor material are contemplated herein also. In one embodiment, the bottom semiconductor layer 6 also includes a single crystalline material having an epitaxial alignment throughout an entirety of the bottom semiconductor layer 6. Initially, a bottom semiconductor portion 10 may extend throughout the entirety of the bottom semiconductor layer 6. The bottom semiconductor portion 10 may have a doping of a first conductivity type at a dopant concentration from about $1.0\times10^{14}/cm^3$ to about $1.0\times10^{19}/cm^3$, and typically from $1.0\times10^{14}/cm^3$ to about $1.0\times10^{17}/cm^3$. While the present disclosure is described with an SOI substrate, embodiments in which a bulk substrate or a hybrid substrate including a bulk portion and an SOI portion can also be practiced. The thickness of the top semiconductor layer 30L may be from about 10 nm to about 300 nm, and typically from about 30 nm to about 150 nm, although lesser and greater thicknesses are contemplated herein also.

The buried insulator layer 20 vertically abuts a top surface of the bottom semiconductor layer 6 and a bottom surface of the top semiconductor layer 30L. The buried insulator layer 20 includes a dielectric material such as silicon oxide, silicon nitride, silicon oxynitride, or a stack thereof. Typically, the buried insulator layer 20 includes silicon oxide. The thickness of the buried insulator layer 20 may be from about 30 nm to about 600 nm, and typically from about 60 nm to about 300 nm, although lesser and greater thickness are contemplated herein also.

Deep trenches extending through the top semiconductor layer 30L, the buried insulator layer 20, and an upper portion of the bottom semiconductor layer 6 are formed employing methods known in the art. A "deep trench" refers to a trench that extends from the top surface 9 of the top semiconductor layer 30L of an SOI substrate through the top semiconductor layer 30L and through the buried insulator layer 20 and into an upper portion of a bottom semiconductor layer 6 if an SOI substrate is employed, or a trench that extends to a depth greater than the depth of a bottommost surface of shallow trench isolation structures employed for device isolation if a bulk substrate is employed. The depth of deep trenches is typically greater than 2 microns, and more typically between 4 microns and 10 microns.

A buried plate 12 is formed by introducing dopant of a second conductivity type through the sidewalls and the bottom surface of the portion of the deep trenches into a portion of the bottom semiconductor portion 10 laterally surrounding and enclosing the deep trenches. The second conductivity is the opposite of the first conductivity type. For example, the first conductivity type may be p-type and the second conductivity type may be n-type, or vice versa. Examples of the dopants include B, Ga, In, P, As, Sb, etc. The dopants may be introduced by ion implantation, plasma doping, or outdiffusion from a dopant containing material such as arsenosilicate glass (ASG), borosilicate glass (BSG), phosphosilicate glass (PSG), etc. The dopant concentration of the buried plate 12 may be from about $1.0 \times 10^{17}/cm^3$ to about $1.0 \times 10^{21}/cm^3$, and typically from $1.0 \times 10^{18}/cm^3$ to about $1.0 \times 10^{20}/cm^3$. The doped portion of the bottom semiconductor portion 10 is converted into the buried plate 12. Upon formation of the buried plate 12, the bottom semiconductor layer 6 includes the remainder of the bottom semiconductor portion 10 and the buried plate 12.

A node dielectric 14 is formed directly on the buried plate 12 inside each deep trench by methods known in the art including, but not limited to, thermal oxidation, thermal nitridation, chemical vapor deposition (CVD), atomic layer deposition (ALD), or a combination of thereof. Dielectric material that may be employed for the node dielectric 14 include silicon oxide, silicon nitride, a high-k material having a dielectric constant greater than the dielectric constant of silicon nitride, or any suitable combination of these materials. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the node dielectric 14 may be from about 3 nm to about 10 nm, although lesser and greater thickness are also explicitly contemplated herein.

A doped semiconductor material is deposited directly on the node dielectric 14 within the deep trenches by methods known in the art, e.g., by chemical vapor deposition (CVD), physical vapor deposition (PVD), atomic layer deposition, etc. The doped semiconductor material may be a polycrystalline or amorphous doped semiconductor material, which includes, but not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials, and/or alloys thereof. The doped semiconductor material may have a doping of the first conductivity type or the second conductivity type, i.e., p-type or n-type. The dopant concentration of the doped semiconductor material may be from about $1.0 \times 10^{19}/cm^3$ to about $1.0 \times 10^{21}/cm^3$ and typically from $3.0 \times 10^{19}/cm^3$ to about $5.0 \times 10^{20}/cm^3$, although lesser and greater dopant concentrations are also contemplated herein.

The excess material above the top surface 9 of the top semiconductor layer 30L is removed, for example, by planarization, a recess etch, or a combination thereof. The remaining portions of the node dielectrics 14 and the doped semiconductor material have top surfaces that are substantially coplanar with the top surface 9 of the top semiconductor layer. The remaining portions of the doped semiconductor material within the trenches form inner electrode 16. A combination of an inner electrode 16, a node dielectric 14 contacting the inner electrode 16, and a portion of a buried plate 12 contacting and surrounding the node dielectric 14 constitute a deep trench capacitor, in which the buried plate 12 functions as an outer electrode. The doped semiconductor material of the inner electrode 16 is herein referred to as a first semiconductor material. In the deep trench capacitor is formed in a semiconductor-on-insulator (SOI) substrate, and the node dielectric 14 extends through the buried insulator layer 20.

Figure 2:
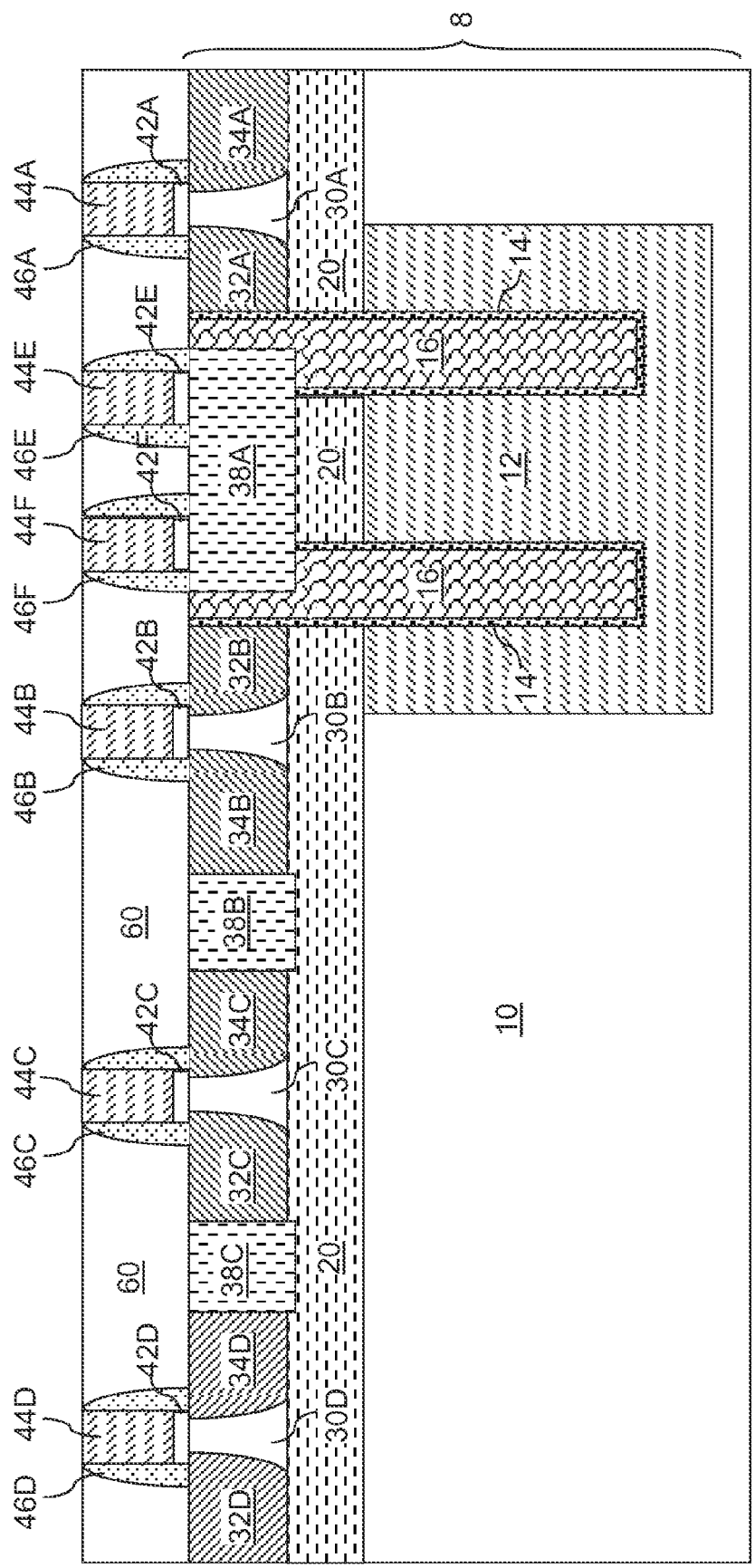
FIG. 2 is a vertical cross-sectional view of the first exemplary semiconductor structure after formation of source and drain regions, disposable gate structures, dielectric gate spacers, and a planarization dielectric layer and a subsequent planarization of the planarization dielectric layer according to the first embodiment of the present disclosure.

Referring to FIG. 2, shallow trench isolation structures can be formed by forming trenches in the top semiconductor layer 30L and filling the trenches with a dielectric material such as silicon oxide and/or silicon nitride. The shallow trench isolation structures can include, for example, a first shallow trench isolation structure 38A, a second shallow trench isolation structure 38B, and a third shallow trench isolation structure 38C. The first shallow trench isolation structure 38A is formed in an area overlying portions of a pair of deep trench capacitors and a portion of the top semiconductor layer 30L therebetween. The second and third shallow trench isolation structures (38B, 38C) can be formed between semiconductor devices that require electrical isolation therebetween.

Further, a source region and a drain region, dummy gate stacks, and dielectric gate spacers are formed for various field effect transistor template structures. The dielectric gate spacers include a dielectric material such as silicon nitride. While the dielectric gate spacers can include silicon oxide or other low dielectric constant materials, the outer sidewalls of the dielectric gate spacers can include silicon nitride. The various filed effect transistor template structures can include, for example, a first access transistor template structure, a second access transistor template structure, an n-type filed effect transistor template structure, and a p-type field effect transistor template structure.

The first access transistor template structure includes a first access transistor body region 30A, a first access transistor source region 32A, a first access transistor drain region 34A, a first access transistor disposable gate dielectric 42A, a first access transistor disposable gate material portion 44A, a first access transistor dielectric gate spacer 46A. The second access transistor template structure includes a second access transistor body region 30B, a second access transistor source region 32B, a second access transistor drain region 34B, a second access transistor disposable gate dielectric 42B, a second access transistor disposable gate material portion 44B, a second access transistor dielectric gate spacer 46B. The n-type field effect transistor template structure includes an n-type field effect transistor body region 30C, an n-type field effect transistor source region 32C, an n-type field effect transistor drain region 34C, an n-type field effect transistor disposable gate dielectric 42C, an n-type field effect transistor disposable gate material portion 44C, an n-type field effect transistor dielectric gate spacer 46C. The p-type field effect transistor template structure includes a p-type field effect transistor body region 30D, a p-type field effect transistor source region 32D, a p-type field effect transistor drain region 34D, a p-type field effect transistor disposable gate dielectric 42D, a p-type field effect transistor disposable gate material portion 44D, a p-type field effect transistor dielectric gate spacer 46C. Typically, each pair of a source region (32A, 32B, 32C, 32D, 32E, 32F) and a drain region (34A, 34B, 34C, 34D, 34E, 34F) of a same transistor are laterally surrounded by a contiguous structure of a shallow trench isolation structure, which can include at least one portion of the first shallow trench isolation structure 38A, the second shallow trench isolation structure 38B, and the third shallow trench isolation structure 38C.

Yet further, additional semiconductor devices and/or semiconductor structures can be formed, which may include, for example, a first temporary passing gate structure and a second temporary passing gate structure. The first temporary passing gate structure and the second temporary passing gate structures can be extensions of additional transistor disposable gate dielectrics, additional transistor disposable gate material portions, and additional transistor dielectric gate spacers. For example, the first temporary passing gate structure can include a third access transistor disposable gate dielectric 42E, a third access transistor disposable gate material portion 44E, and a third access transistor dielectric gate spacer 46E, and the fourth temporary passing gate structure can include a fourth access transistor disposable gate dielectric 42F, a fourth access transistor disposable gate material portion 44F, and a fourth access transistor dielectric gate spacer 46F.

The various disposable gate dielectrics (42A, 42B, 42C, 42D, 42E, 42F) can be a dielectric material such as silicon oxide. The disposable gate material portions (44A, 44B, 44C, 44D, 44E, 44F) can include a semiconductor material such as germanium, a silicon germanium alloy, silicon, or a compound semiconductor material. Each stack of a disposable gate dielectric (42A, 42B, 42C, 42D, 42E, 42F) and an overlying disposable gate material portion (44A, 44B, 44C, 44D, 44E, 44F) forms a disposable gate structure, which is removed in subsequent processing steps. The various dielectric gate spacers (46A, 46B, 46C, 46D, 46E, 46F) are not removed in subsequent processing steps.

A planarization dielectric layer 60 is deposited over the disposable gate structures, the various gate spacers, and the semiconductor substrate 8. The planarization dielectric layer 60 includes a dielectric material such as undoped silicate glass, doped silicate glass, organosilicate glass including a SiCOH-based material, or a combination thereof. The planarization dielectric layer 60 includes a material that is different from the material of the outer sidewalls of the dielectric gate spacers (46A, 46B, 46C, 46D, 46E, 46F). The planarization dielectric layer 60 is subsequently planarized, for example, by chemical mechanical polishing, a recess etch, or a combination thereof. As planarized, the top surface of the planarization dielectric layer 60 can be coplanar with topmost surfaces of the disposable gate material portion (44A, 44B, 44C, 44D, 44E, 44F). Further, the planar dielectric surface of the planarization dielectric layer 50 can be located at the same level as topmost surfaces of the dielectric gate spacers (46A, 46B, 46C, 46D, 46E, 46F).

At this step, the first access transistor source region 32A and the second access transistor source region 32B is not electrically connected to an inner electrode 16 of a deep trench capacitor (12, 14, 16), i.e., does not have an electrically conductive path to any of the inner electrodes 12 because of the presence of at least one node dielectric 14 between each of the first access transistor source region 32A and the second access transistor source region 32B and the various inner electrodes 16.

Figure 3:
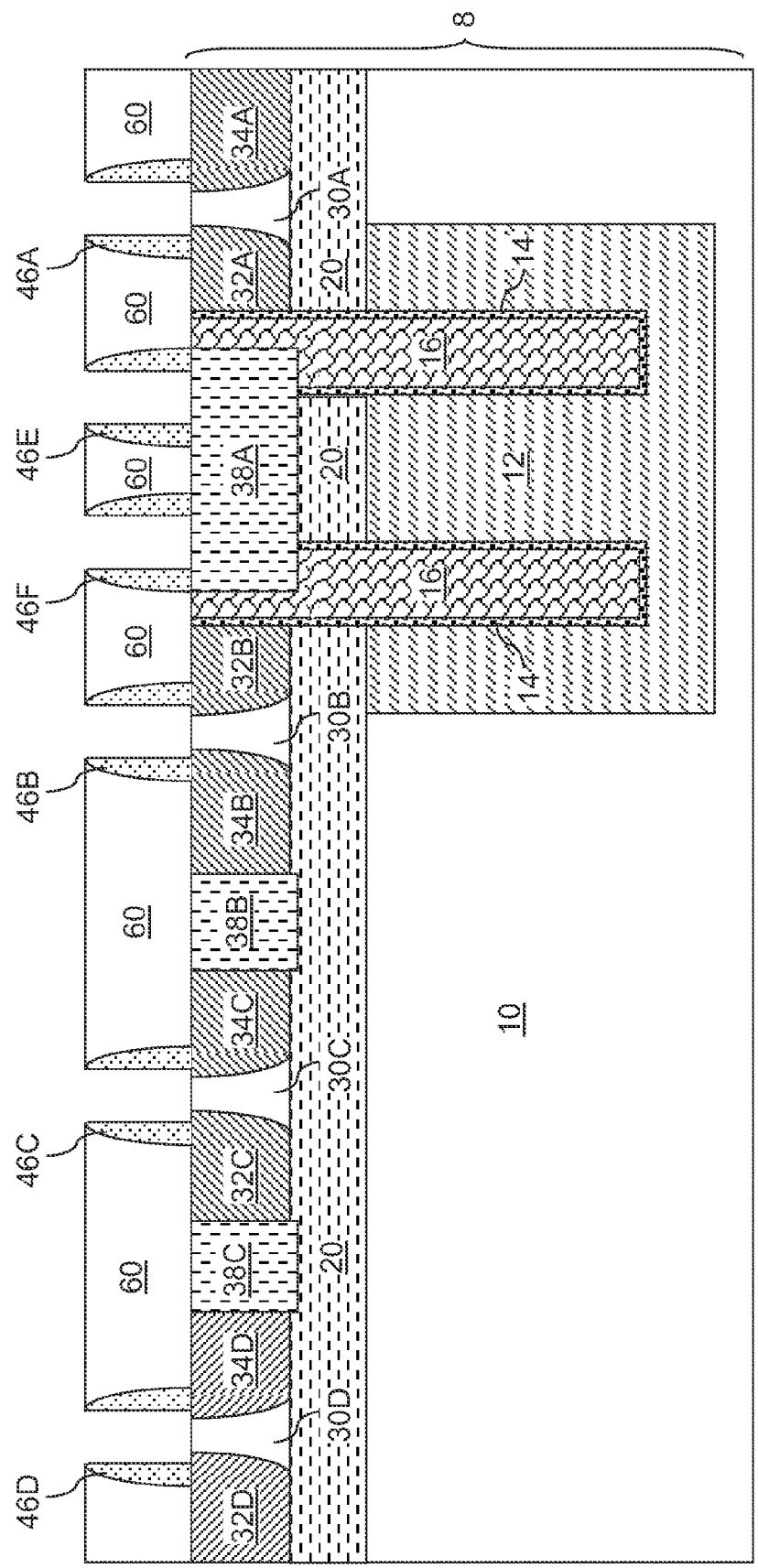
FIG. 3 is a vertical cross-sectional view of the first exemplary semiconductor structure after removal of disposable gate structures according to the first embodiment of the present disclosure.

Referring to FIG. 3, the disposable gate structures (44A, 44B, 44C, 44D, 44E, 44F, 42A, 42B, 42C, 42D, 42E, 42F) are removed selective to the planarization dielectric layer 60, the various dielectric gate spacers (46A, 46B, 46C, 46D, 46E, 46F), and the various body regions (30A, 30B, 30C, 30D). The removal of the disposable gate structures can be effected by a recess etch, which can include an anisotropic etch, an isotropic etch, or a combination thereof. The planarization dielectric layer 60 can be employed as an etch mask. A gate cavity is formed between the horizontal plane of the top surface of the planarization dielectric layer 60 and the exposed topmost surfaces of the semiconductor substrate 8.

Figure 4:
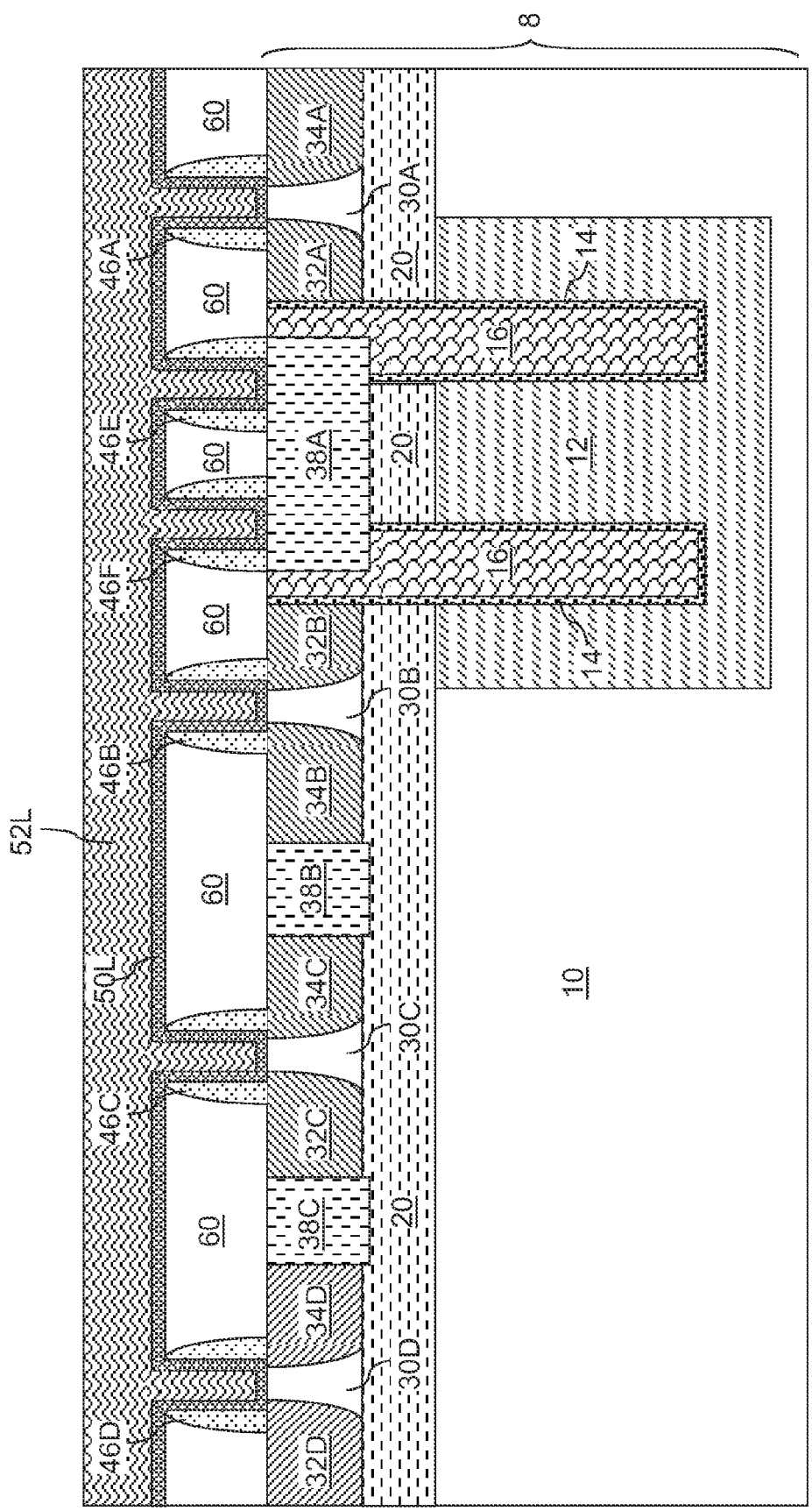
FIG. 4 is a vertical cross-sectional view of the first exemplary semiconductor structure after depositing a stack of a gate dielectric layer and a gate conductor layer according to the first embodiment of the present disclosure.

Referring to FIG. 4, a stack of a gate dielectric layer 50L and a gate conductor layer 52L is deposited in the gate cavities and on a planar dielectric surface, i.e., the top surface, of the planarization dielectric layer 60. The gate cavities are filled with the stack of the gate dielectric layer 50L and the gate conductor layer 52L. The gate dielectric layer 50L can contact the entirety of sidewalls of each of the various gate spacers (46A, 46B, 46C, 46D, 46E, 46F).

The gate dielectric layer 50L is deposited as a contiguous layer that is contiguous throughout the entirety thereof. The gate dielectric layer 50L can be a high dielectric constant (high-k) material layer having a dielectric constant greater than 8.0. The gate dielectric layer 50L can include a dielectric metal oxide, which is a high-k material having a dielectric constant greater than 8.0 and containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 50L, as measured at horizontal portions, can be from 0.9 nm to 6 nm, and preferably from 1.2 nm to 3 nm. The high-k material layer may have an effective oxide thickness on the order of or less than 1 nm.

The gate conductor layer 52L includes a conductive material such as a metal, a doped semiconductor material, or a combination thereof. As used herein, a "metal" refers to any of an elemental metal, an alloy of elemental metals, a conductive compound of an elemental metal and a non-metal element, and alloys and compounds thereof. The gate conductor layer 52L can be formed, for example, by physical vapor deposition (PVD, i.e., sputtering), chemical vapor deposition, or atomic layer deposition (ALD). The thickness of the gate conductor layer 52L, as measured above the planarization dielectric layer 60, is greater than the height of the planarization dielectric layer 60 or half the greatest width of gate cavities to ensure that all gate cavities are filled with the gate conductor layer 52L.

Figure 5:
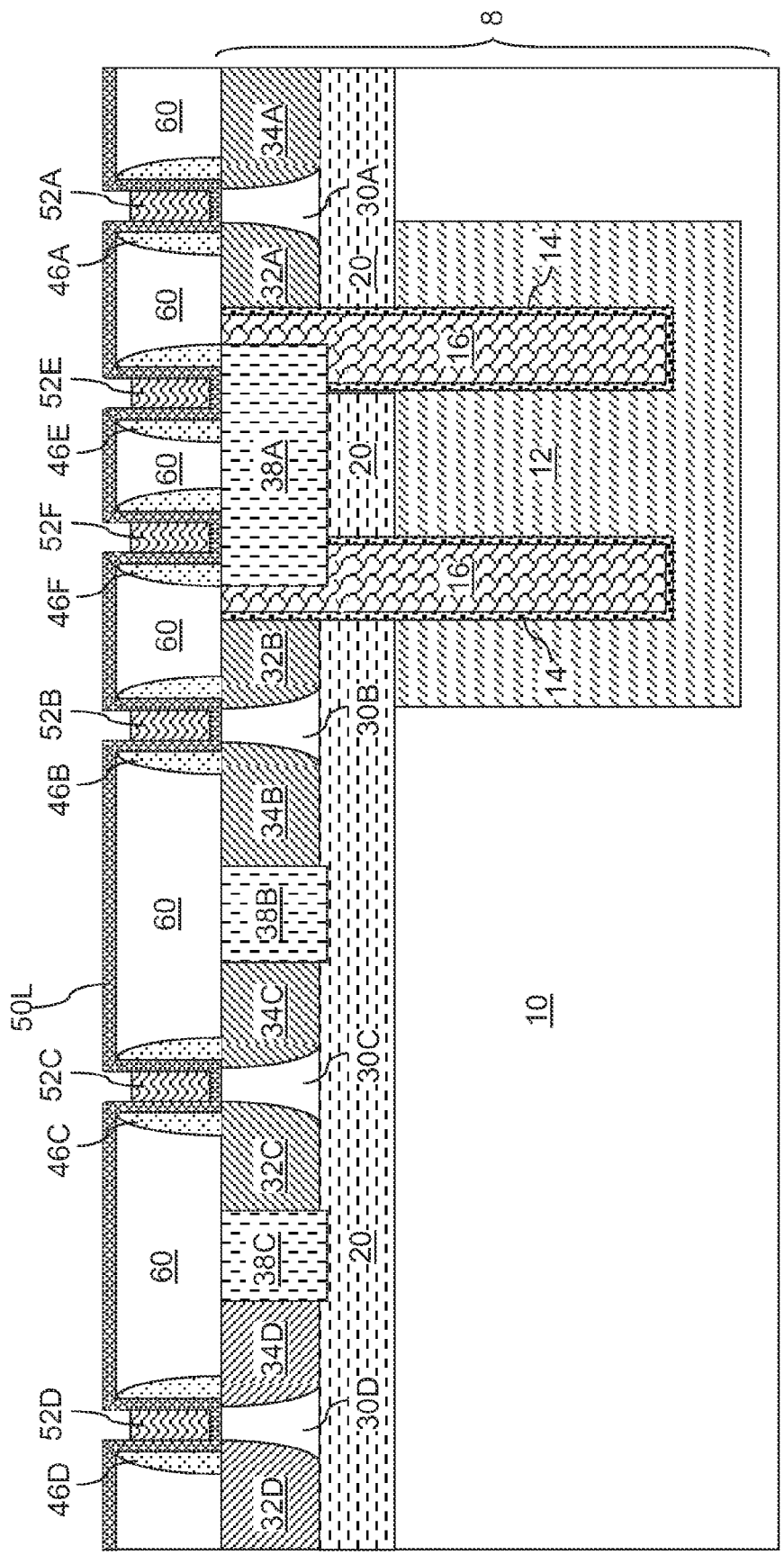
FIG. 5 is a vertical cross-sectional view of the first exemplary semiconductor structure after recessing the gate conductor layer below a topmost surface of the planarization dielectric layer according to the first embodiment of the present disclosure.

Referring to FIG. 5, the gate conductor layer 52L is recessed below the topmost surface of the planarization dielectric layer 60. In one embodiment, the gate dielectric layer 50L can be employed as an etch stop layer so that the gate dielectric layer 50L is present after the recessing of the gate conductor layer 52L. In another embodiment, the gate dielectric layer 50L can be partially or completely removed from above the planarization dielectric layer 60. After the recessing, the recessed surfaces of remaining portions of the gate conductor layer 52L are located below the topmost surface of the planarization dielectric layer 60. The vertical distance between the recessed surfaces of remaining portions of the gate conductor layer 52L and the topmost surface of the planarization dielectric layer 60 can be from 2 nm to 20 nm, although lesser and greater vertical distances can also be employed. The remaining portions of the gate conductor layer 50L are herein referred to as gate conductors, which include a first gate conductor 52A, a second gate conductor 52B, a third gate conductor 52C, a fourth gate conductor 52D, a fifth gate conductor 52E, and a sixth gate conductor 52F. The various gate conductors (52A, 52B, 52C, 52D, 52E, 52F) are recessed relative to the planar dielectric surface of the planarization dielectric layer 60.

Figure 6:
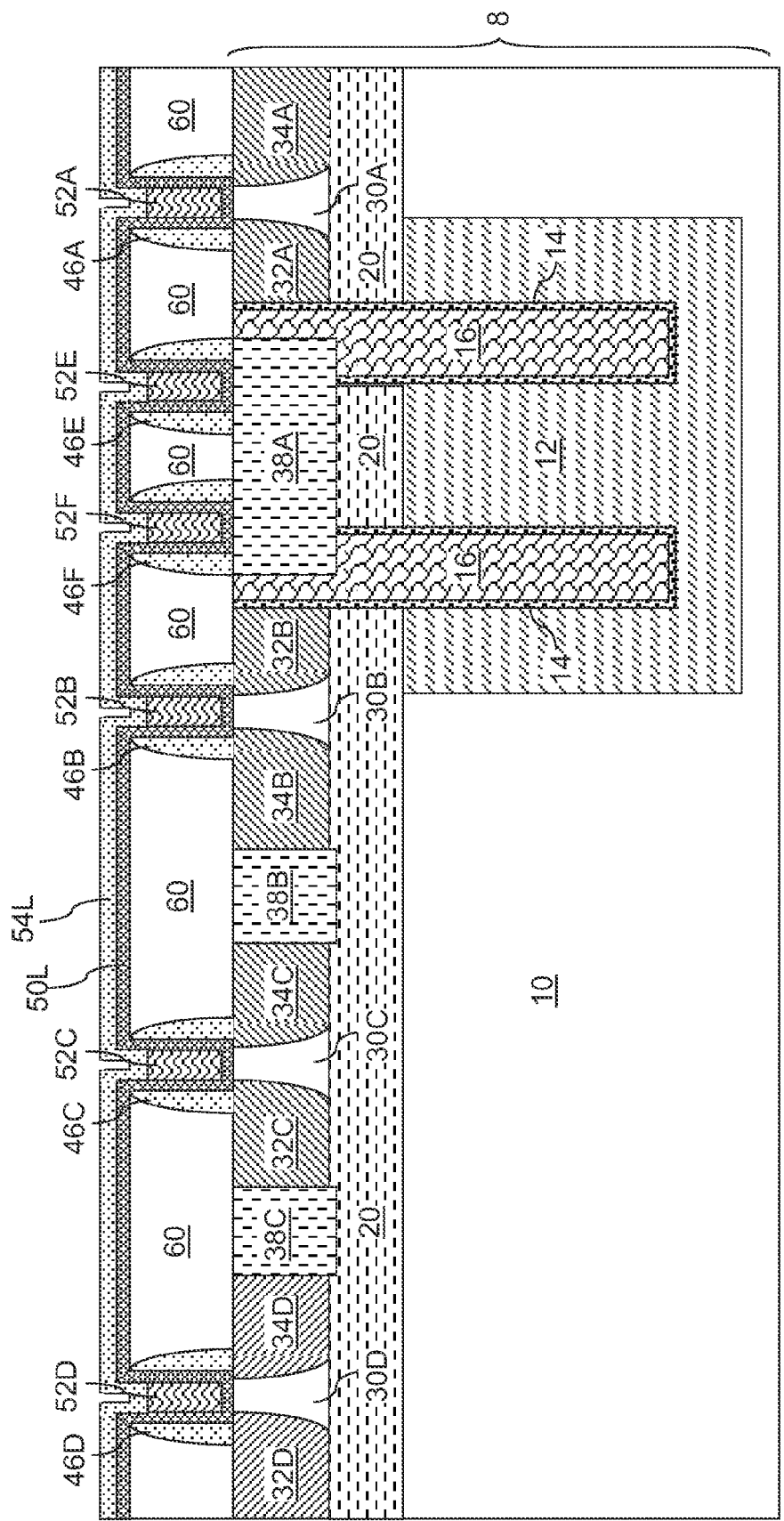
FIG. 6 is a vertical cross-sectional view of the first exemplary semiconductor structure after deposition of a dielectric metal oxide layer according to the first embodiment of the present disclosure.

Referring to FIG. 6, a dielectric metal oxide layer 54L is deposited on the top surfaces of the various gate conductors (52A, 52B, 52C, 52D, 52E, 52F) and exposed surfaces of the gate dielectric layer 50L, i.e., the planar dielectric surface of the planarization dielectric layer 60. The dielectric metal oxide layer 54L includes a high-k material having a dielectric constant greater than 8.0 and containing a metal and oxygen. The high-k material of the dielectric metal oxide layer 54L can be any high dielectric constant metal oxide that can be employed for the gate dielectric layer 50L. The dielectric metal oxide layer 54L can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The thickness of the dielectric metal oxide layer 54L is greater than the vertical distance between the recessed surfaces of remaining portions of the gate conductor layer 52L and the topmost surface of the planarization dielectric layer 60, and can be from 3 nm to 30 nm, although lesser and greater thicknesses can also be employed.

Figure 7:
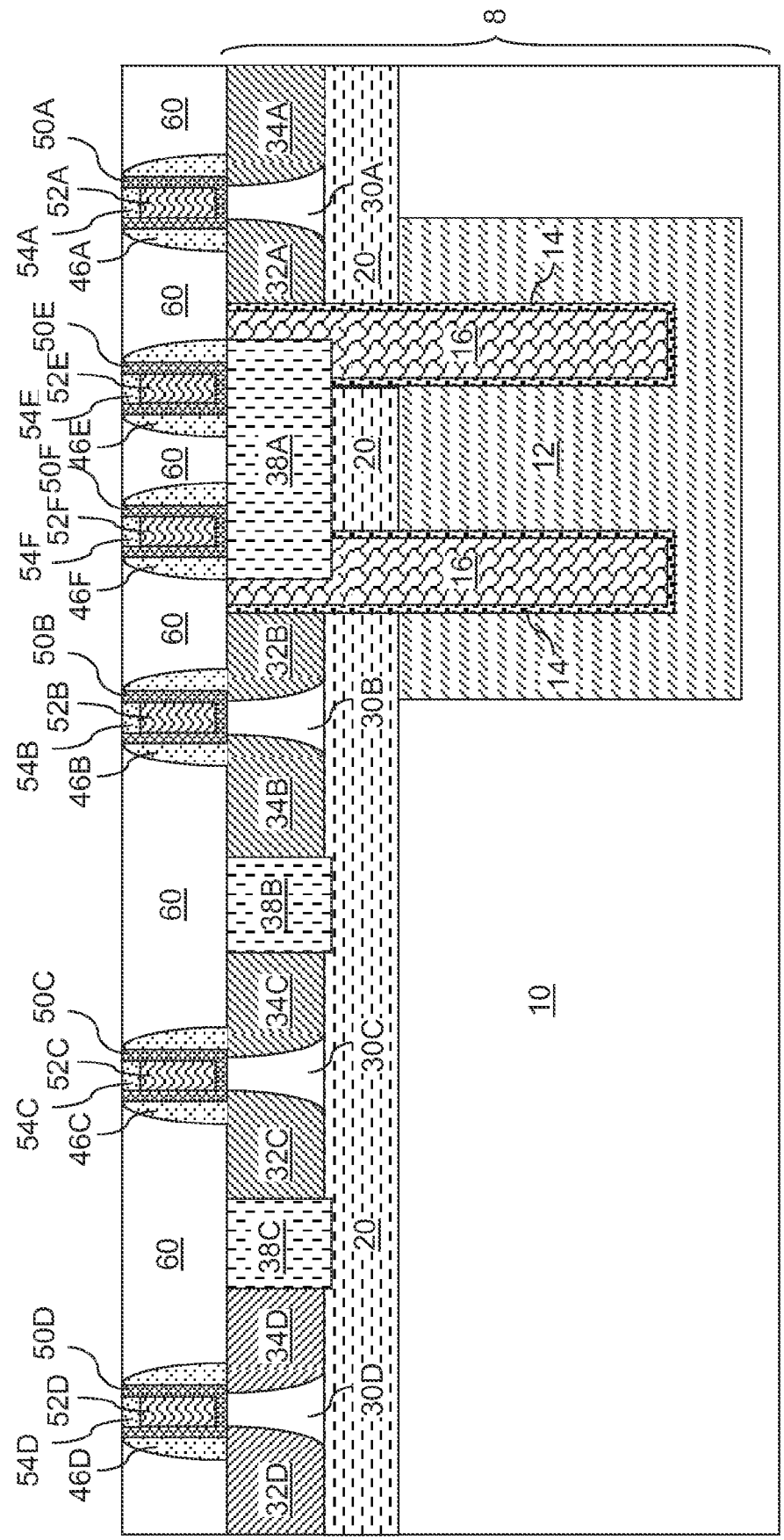
FIG. 7 is a vertical cross-sectional view of the first exemplary semiconductor structure after removal of portions of the dielectric metal oxide layer above the planarization dielectric layer by planarization according to the first embodiment of the present disclosure.

Referring to FIG. 7, the portions of the dielectric metal oxide layer 52L above the planarization dielectric layer 60 are removed by planarization, which can be effected by chemical mechanical planarization, recess etch, or a combination thereof. Any remaining portion of the gate dielectric layer 50L is also removed from above the top surface of the planarization dielectric layer 60. The removing portions of the dielectric metal oxide layer 54L are dielectric gate caps, which include a first dielectric gate cap 54A that overlies the first gate conductor 52A, a first dielectric gate cap 54A that overlies the first gate conductor 52A, a second dielectric gate cap 54B that overlies the second gate conductor 52B, a third dielectric gate cap 54C that overlies the third gate conductor 52C, a fourth dielectric gate cap 54D that overlies the fourth gate conductor 52D, a fifth dielectric gate cap 54E that overlies the fifth gate conductor 52E, and a sixth dielectric gate cap 54F that overlies the sixth gate conductor 52F. The thickness of the various dielectric gate caps (54A, 54B, 54C, 54D, 54E, 54F) can be from 3 nm to 30 nm, although lesser and greater thicknesses can also be employed.

The remaining portions of the dielectric layer 50L after planarization are gate dielectrics, which include a first gate dielectric 50A, a second gate dielectric 50B, a third gate dielectric 50C, a fourth gate dielectric 50D, a fifth gate dielectric 50E, and a sixth gate dielectric 50F. Each gate dielectric (50A, 50B, 50C, 50D, 50E, 50F) laterally surrounds a stack of a gate conductor (52A, 52B, 52C, 52D, 52E, or 52F) and a dielectric gate cap (54A, 54B, 54C, 54D, 54E, or 54F). The entirety of sidewalls of each gate conductor (52A, 52B, 52C, 52D, 52E, 52F) and the entirety of sidewalls of dielectric gate caps (54A, 54B, 54C, 54D, 54E, 54F) contact an inner sidewall of a gate dielectric (50A, 50B, 50C, 50D, 50E, 50F). Outer sidewalls of each gate dielectric (50A, 50B, 50C, 50D, 50E, 50F) contact an entirety of inner sidewalls of a dielectric gate spacer (46A, 46B, 46C, 46D, 46E, 46F). Outer sidewalls of the dielectric gate caps (54A, 54B, 54C, 54D, 54E, 54F) contact an upper portion of inner sidewalls of a gate dielectric (50A, 50B, 50C, 50D, 50E, 50F).

Figure 8:
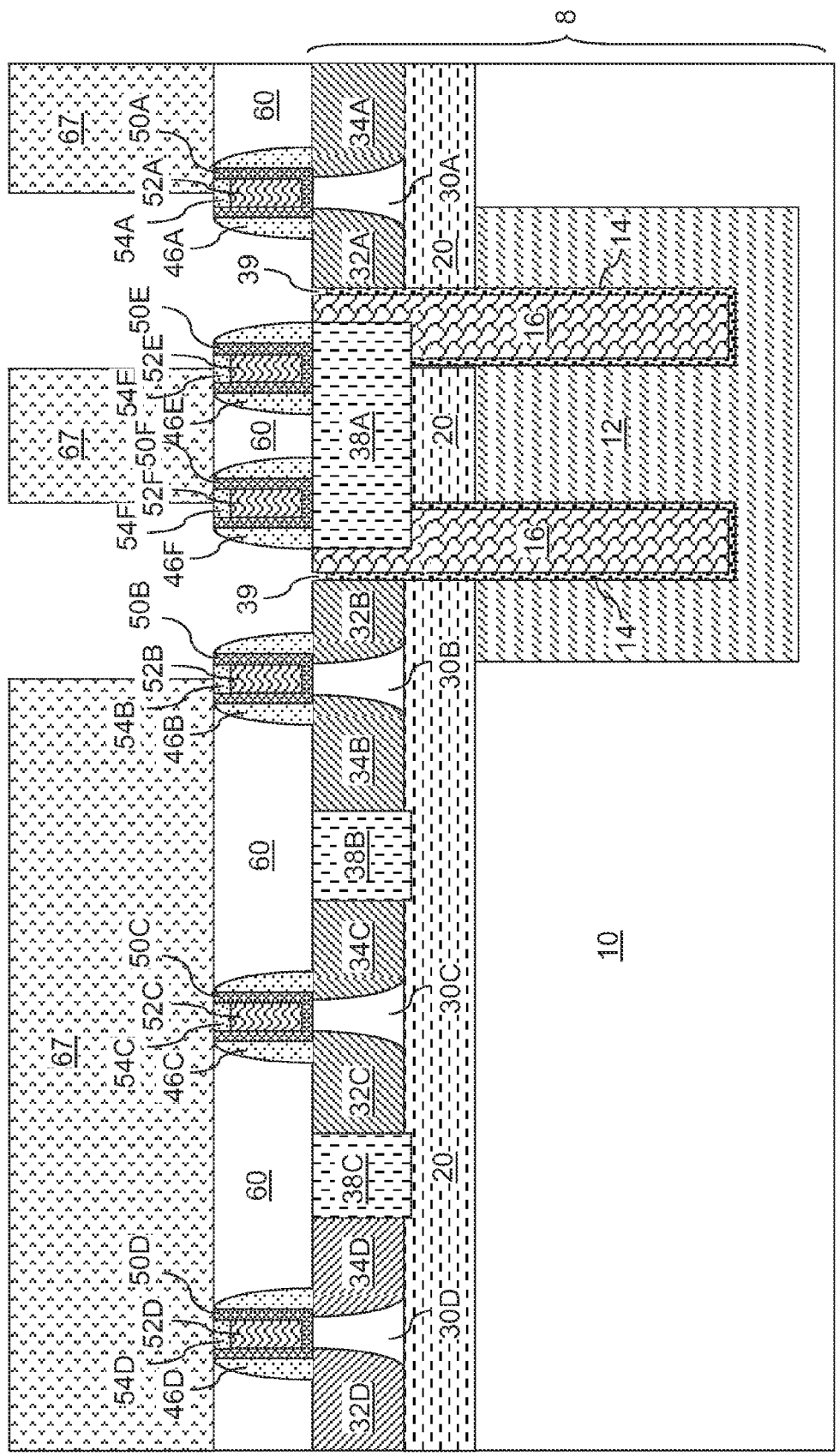
FIG. 8 is a vertical cross-sectional view of the first exemplary semiconductor structure after application and lithographic patterning of a first photoresist and removal of exposed portions of the planarization dielectric layer according to the first embodiment of the present disclosure.

Referring to FIG. 8, a first photoresist 67 is applied over the top surface of the planarization dielectric layer 60 and lithographically patterned to form openings therein over areas in which access transistor source regions are located in proximity to an adjacent deep trench capacitor. For example, the area of the opening in the first photoresist 67 can include a first contiguous area and a second contiguous. The first contiguous area is located over the first access transistor source region 32A, a node dielectric 39 that contacts the first access transistor source region 32A, and an inner electrode 16 which contacts that node dielectric 39. The second contiguous area is located over the second access transistor source region 32B, a node dielectric 39 that contacts the second access transistor source region 32B, and an inner electrode 16 which contacts that node dielectric 39.

The exposed portions of the planarization dielectric layer 60 are removed selectively to the materials of the dielectric gate spacers (46A, 46B, 46E, 46F), the gate dielectrics (50A, 50B, 50E, 50F), and the dielectric gate caps (54A, 54B, 54E, 54F) by employing an etch, which can be an anisotropic etch or an isotropic etch. The combination of the first photoresist 67 and the materials of the dielectric gate spacers (46A, 46B, 46E, 46F), the gate dielectrics (50A, 50B, 50E, 50F), and the dielectric gate caps (54A, 54B, 54E, 54F) function as an etch mask during the removal of the exposed portions of the planarization dielectric layer 60. Top surfaces of the first access transistor source region 32A, the second access transistor source region 32B, the inner electrodes 16, and the node dielectrics 14 are exposed after the removal of the exposed portions of the planarization dielectric layer 60. Optionally, topmost portions of the node dielectrics 14 can be removed to form divots 39 between an access transistor source region (32A, 32B) and an inner electrode 16. If divots 39 are formed, the topmost surfaces of the node dielectrics 14 are recessed below the top surfaces of the access transistor source regions (32A, 32B) and the inner electrode 16.

The planarization dielectric layer 60 is not removed from the area in which the first photoresist 67 covers the planarization dielectric layer 60, i.e., in the area including the first access transistor drain region 34A, the second access transistor drain region 34B, and the areas of an n-type field effect transistor and a p-type field effect transistor. The area of the n-type field effect transistor includes the n-type field effect transistor body region 30C, the n-type field effect transistor source region 32C and the n-type field effect transistor drain region 34C. The area of the p-type field effect transistor includes the p-type field effect transistor body region 30D, the p-type field effect transistor source region 32D, and the p-type field effect transistor drain region 34D. The first photoresist 67 is subsequently removed.

Figure 9:
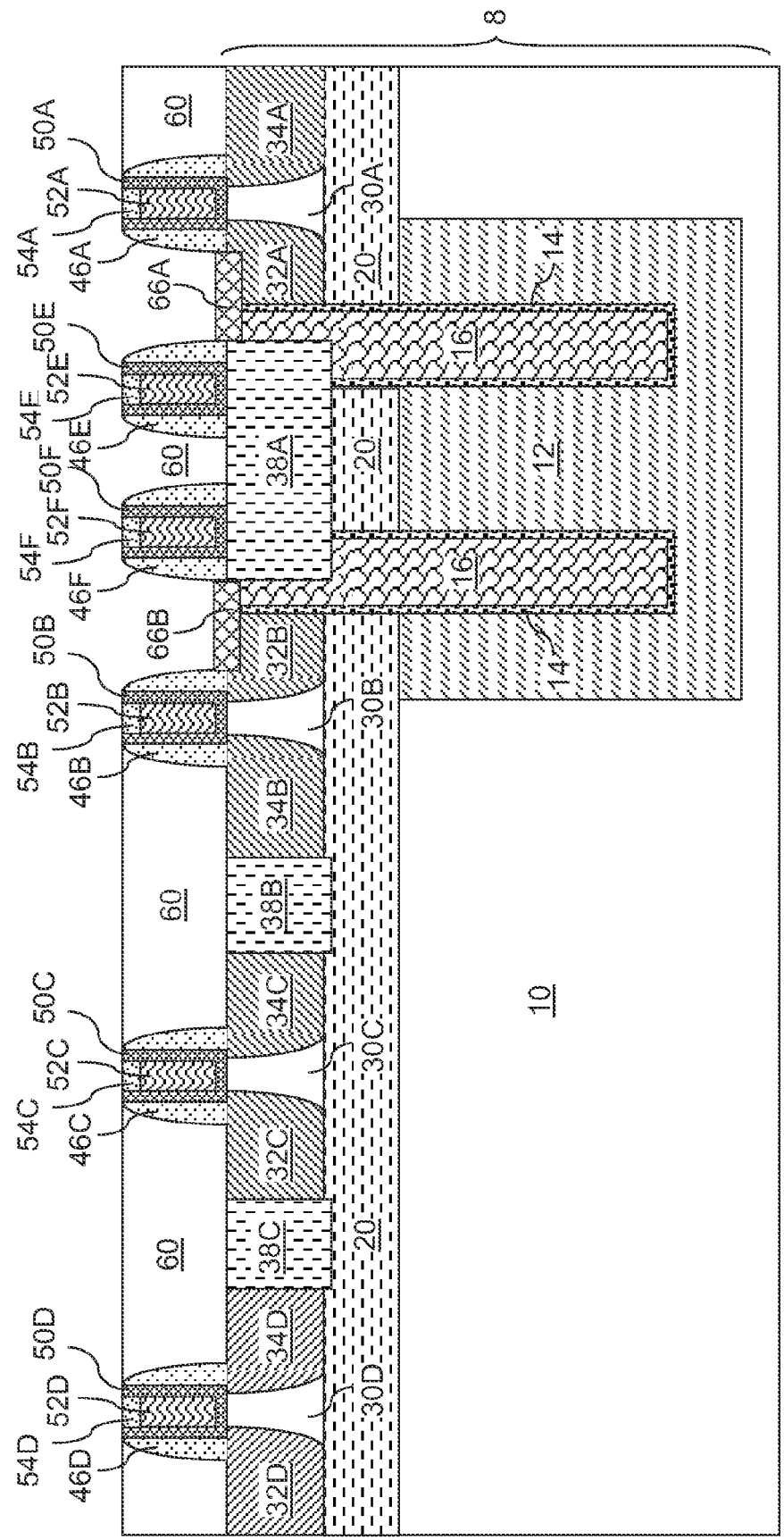
FIG. 9 is a vertical cross-sectional view of the first exemplary semiconductor structure after removal of the first photoresist and formation of metal semiconductor alloy portions according to the first embodiment of the present disclosure.

Referring to FIG. 9, various metal semiconductor alloy portions are formed on exposed semiconductor surfaces, for example, by depositing a metal layer (not shown), by annealing the first exemplary semiconductor structure, and by removing unreacted portions of the metal layer. The metal layer includes a first metal that can interact with the semiconductor materials of the first access transistor source region 32A, the second access transistor source region 32B, and the inner electrodes 16. For example, the first metal layer can include Ti, Ta, W, Mo, V, Co, Ni, Pt, or a combination thereof.

The anneal is performed at an elevated temperature at which a reaction between the metal layer and underlying semiconductor material portions occurs. During this reaction, the first metal in the metal layer diffuses into the underlying semiconductor material portions and the semiconductor material in the underlying semiconductor material portions diffuse into the metal layer to form the various metal semiconductor alloy portions. The various metal semiconductor alloy portions include a first metal semiconductor alloy portion 66A and a second metal semiconductor alloy portion 66B. The first metal semiconductor alloy portion 66A contacts the first access transistor source region 32A, a node dielectric 14, and an inner electrode 16. The second metal semiconductor alloy portion 66B contacts the second access transistor source region 32B, another node dielectric 14, and another inner electrode 16. If the first access transistor source region 32A, a node dielectric 14, and/or an inner electrode 16 include silicon, the various metal semiconductor alloy portions (66A, 66B) can include a metal silicide including the first metal. If the first access transistor source region 32A, a node dielectric 14, and/or an inner electrode 16 include germanium, the various metal semiconductor alloy portions (66A, 66B) can include a metal germanide including the first metal.

Each of the first metal semiconductor alloy portion 66A and the second metal semiconductor alloy portions 66B laterally contacts a dielectric gate spacer (46A, 46B) and the first shallow trench isolation structure 38A because the lateral extent of the first metal semiconductor alloy portion 66A and the second metal semiconductor alloy portions 66B is limited by a dielectric gate spacer (46A, 46B) and the first shallow trench isolation structure 38A. For example, the first metal semiconductor alloy portion 66A laterally contacts the first dielectric gate spacer 46A and the fifth dielectric gate spacer 46E, and the second metal semiconductor alloy portion 66B laterally contacts the second dielectric gate spacer 46B and the sixth dielectric gate spacer 46F.

Figure 10:
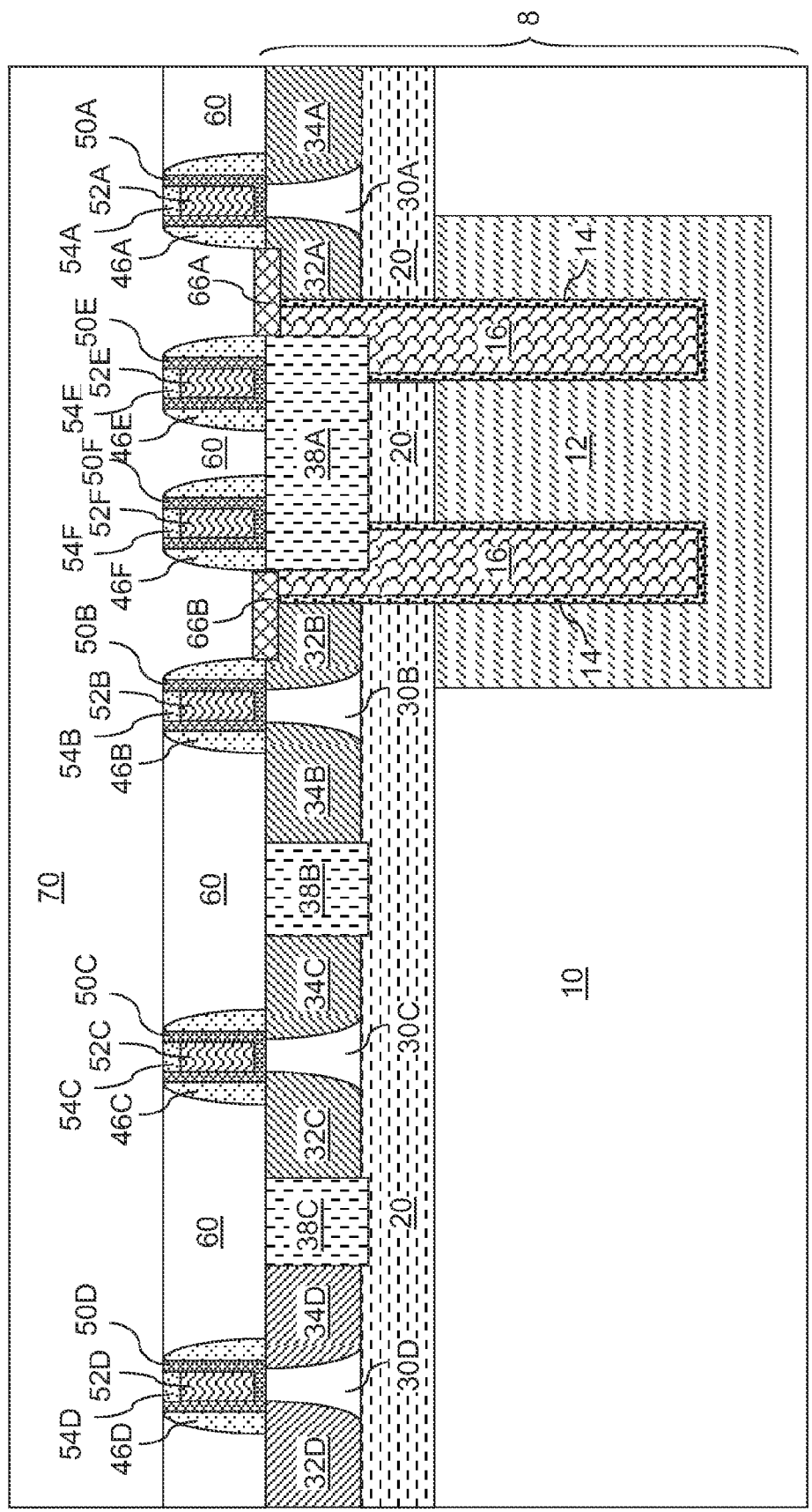
FIG. 10 is a vertical cross-sectional view of the first exemplary semiconductor structure after deposition of a contact level dielectric layer according to the first embodiment of the present disclosure.

Referring to FIG. 10, a contact level dielectric layer 70 is deposited on the various metal semiconductor alloy portions (66A, 66B) and the planarization dielectric layer 60, for example, by chemical vapor deposition (CVD). The contact level dielectric layer 70 includes a dielectric material such as silicon oxide, silicon nitride, porous or non-porous organosilicate glass, or a combination thereof. The thickness of the contact level dielectric layer 70 can be from 50 nm to 500 nm, although lesser and greater thicknesses can also be employed. Optionally, the top surface of the contact level dielectric layer 70 may be planarized, for example, by chemical mechanical planarization.

Figure 11:
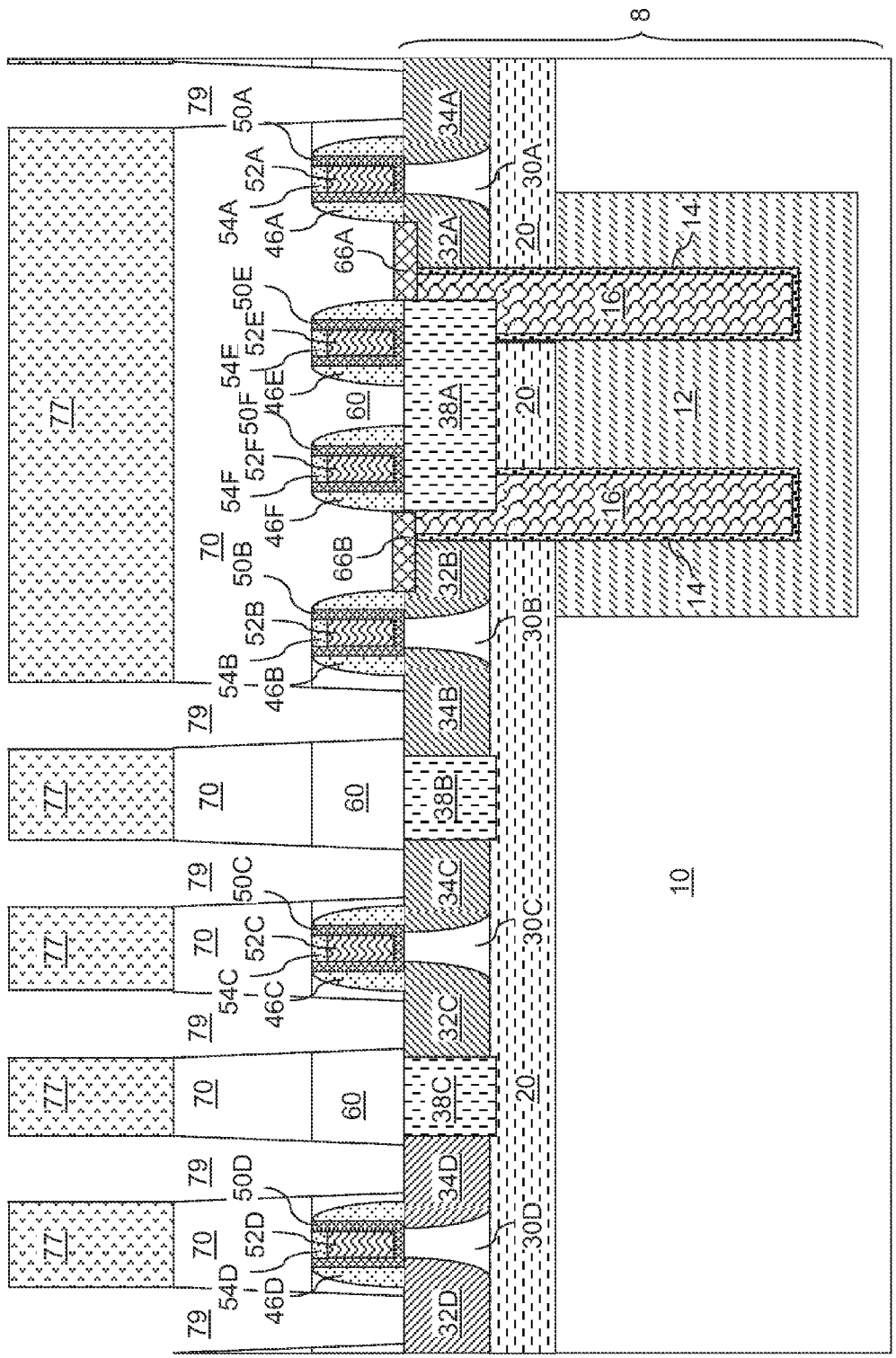
FIG. 11 is a vertical cross-sectional view of the first exemplary semiconductor structure after application and patterning of a second photoresist and formation of contact via holes according to the first embodiment of the present disclosure.

Referring to FIG. 11, a second photoresist 77 is applied over the contact level dielectric layer 70 and is lithographically patterned to form openings over areas in which contact via structures are to be formed. Contact via cavities 79 are formed in the stack of the planarization dielectric layer 70 and the contact level dielectric layer 70 by transferring the pattern of the openings in the second photoresist 77 employing an anisotropic etch such as a reactive ion etch so that semiconductor surfaces are exposed in each of the contact via cavities 79. Specifically, top surfaces of the first access transistor drain region 34A, the second access transistor drain region 34B, the n-type field effect transistor source region 32C, the n-type field effect transistor drain region 34C, the p-type field effect transistor source region 32D, and the p-type field effect transistor drain region 34D. The second photoresist 77 is subsequently removed.

Figure 12:
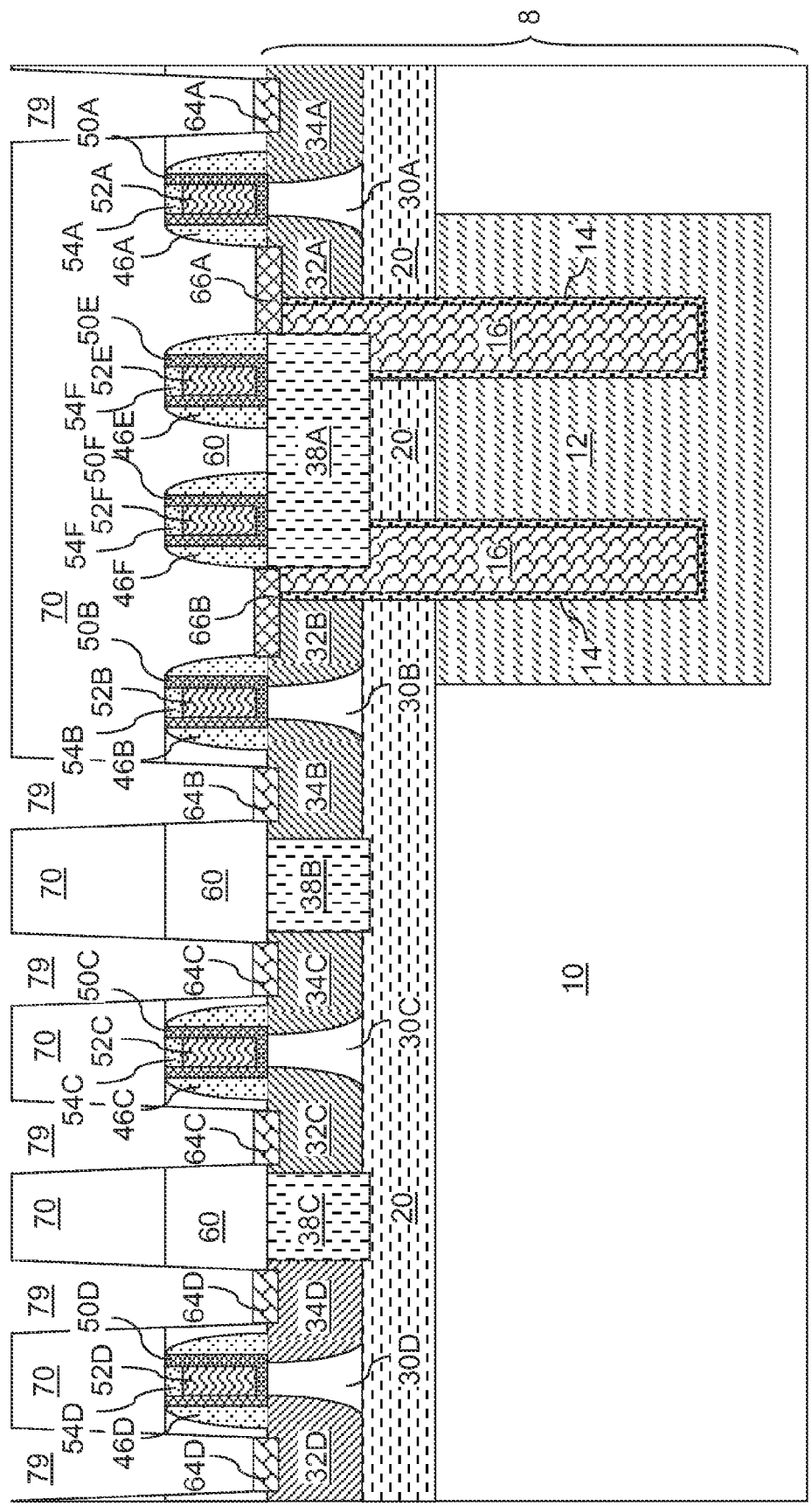
FIG. 12 is a vertical cross-sectional view of the first exemplary semiconductor structure after formation of additional metal semiconductor alloy portions according to the first embodiment of the present disclosure.

Referring to FIG. 12, additional metal semiconductor alloy portions are formed on exposed semiconductor surfaces, for example, by depositing a metal layer (not shown), by annealing the first exemplary semiconductor structure, and by removing unreacted portions of the metal layer. The metal layer includes a second metal that can interact with the semiconductor materials of the first access transistor drain region 34A, the second access transistor drain region 34B, the n-type field effect transistor source region 32C, the n-type field effect transistor drain region 34C, the p-type field effect transistor source region 32D, and the p-type field effect transistor drain region 34D. For example, the second metal layer can include Ti, Ta, W, Mo, V, Co, Ni, Pt, or a combination thereof. The second metal can be different from, or the same as, the first metal.

The anneal is performed at an elevated temperature at which a reaction between the metal layer and underlying semiconductor material portions occurs. During this reaction, the second metal in the metal layer diffuses into the underlying semiconductor material portions and the semiconductor material in the underlying semiconductor material portions diffuse into the metal layer to form the additional metal semiconductor alloy portions. The additional metal semiconductor alloy portions include a first additional metal semiconductor alloy portion 64A, a second additional metal semiconductor alloy portion 64B, third additional metal semiconductor alloy portions 64C, and fourth additional metal semiconductor alloy portions 64D. The first additional metal semiconductor alloy portion 64A contacts the first access transistor drain region 34A. The second additional metal semiconductor alloy portion 64B contacts the second access transistor drain region 34B. The third additional metal semiconductor alloy portions 64C contact the n-type field effect transistor source region 32C and the n-type field effect transistor drain region 34C. The fourth additional metal semiconductor alloy portions 64D contact the p-type field effect transistor source region 32D and the p-type field effect transistor drain region 34D.

If the underlying semiconductor material includes silicon, the additional metal semiconductor alloy portions (64A, 64B, 64C, 64D) can include a metal silicide including the second metal. If the underlying semiconductor material includes germanium, the additional metal semiconductor alloy portions (64A, 64B, 64C, 64D) can include a metal germanide including the second metal.

Unlike the first metal semiconductor alloy portion 66A and the second metal semiconductor alloy portions 66B, the lateral extent of the additional metal semiconductor alloy portions (64A, 64B, 64C, 64D) is not limited by dielectric gate spacers (46A, 46B, 46C, 46D, 46E, 46F) or shallow trench isolation structures (38A, 38B, 38C). Instead, the lateral extent of the additional metal semiconductor alloy portions (64A, 64B, 64C, 64D) is limited by the size of the opening at the bottom of the contact via cavities 79. Thus, the additional metal semiconductor alloy portions (64A, 64B, 64C, 64D) can be laterally spaced from at least one of the dielectric gate spacers (46A, 46B, 46C, 46D, 46E, 46F) and a most adjacent shallow trench isolation structure (38A, 38B, 38C). Because the second metal can be different from the first metal, the additional metal semiconductor alloy portions (64A, 64B, 64C, 64D) can include a different metal than the first metal semiconductor alloy portion 66A and the second metal semiconductor alloy portions 66B.

Figure 13:
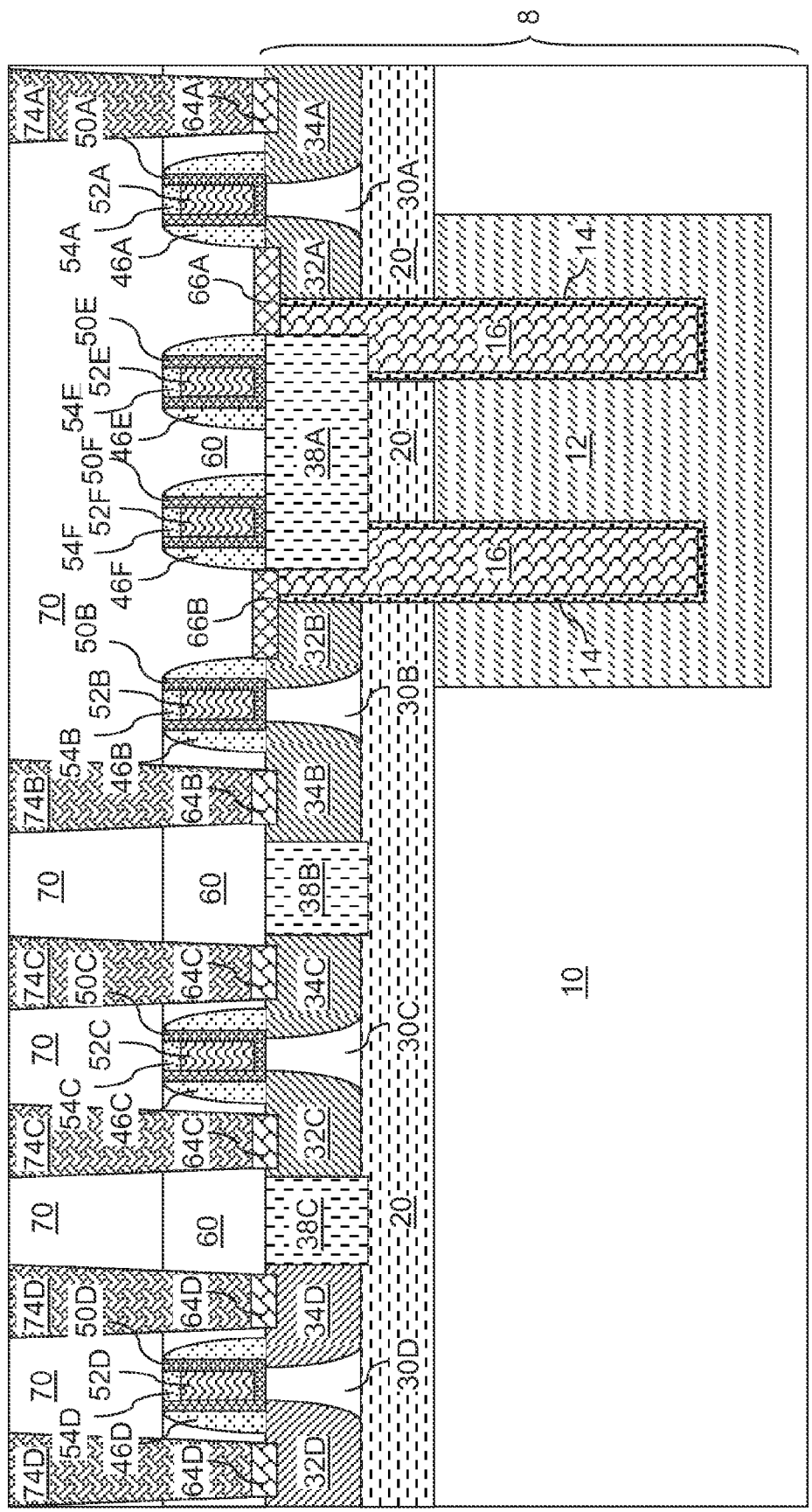
FIG. 13 is a vertical cross-sectional view of the first exemplary semiconductor structure after formation of contact via structures according to the first embodiment of the present disclosure.

Referring to FIG. 13, various contact via structures are formed by deposition of a metal into the contact via cavities 79 and removing excess metal above the top surface of the contact level dielectric layer 70 by planarization. The various contact via structures can include a first contact via structure 74A that contacts a top surface of the first additional metal semiconductor alloy portion 64A, a second contact via structure 74B that contacts a top surface of the second additional metal semiconductor alloy portion 64B, third contact via structures 74C that contact a top surface of the third additional metal semiconductor alloy portions 64C, and fourth contact via structures 74D that contact a top surface of the fourth additional metal semiconductor alloy portions 64D. The first metal semiconductor alloy portion 66A and the second metal semiconductor alloy portions 66B are not contacted by any contact via structure because it is not necessary to provide an electrical contact to the inner electrodes 16 or access transistor source regions (32A, 32B).

Figure 14:
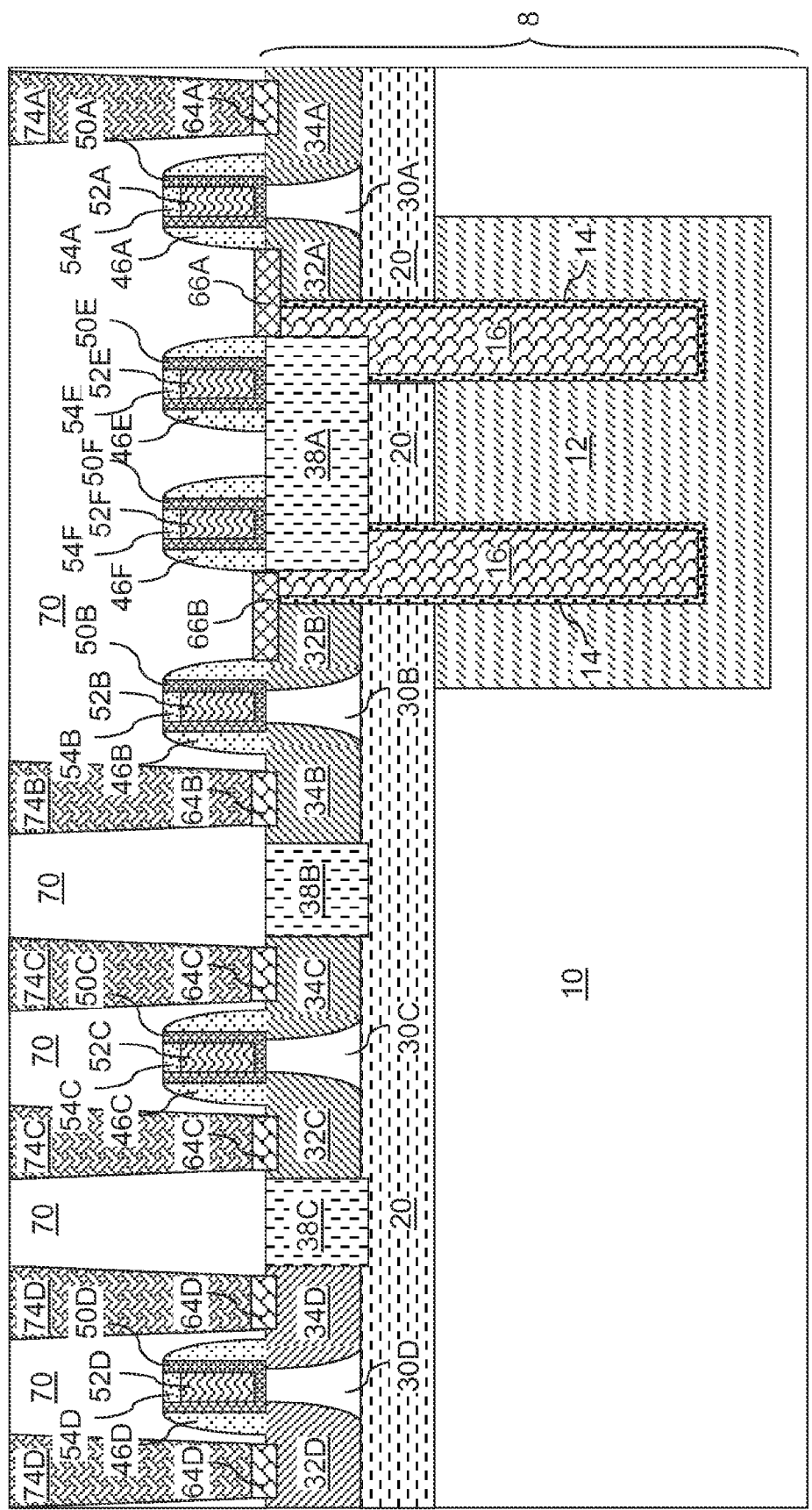
FIG. 14 is a vertical cross-sectional view of a variation of the first exemplary semiconductor structure according to the first embodiment of the present disclosure.

Referring to FIG. 14, a variation of the first exemplary semiconductor structure can be derived from the first exemplary semiconductor structure by removing the planarization dielectric layer 60 after the processing steps of FIG. 9 and prior to the processing steps of FIG. 10. Thus, the planarization dielectric layer 60 is removed from above the inner electrodes 16, the access transistor source regions (32A, 32B), the source regions (32C, 32D) of the p-type field effect transistor and the n-type field effect transistor, and the drain regions (34A, 34B, 34C, 34D) of the access transistor, the p-type field effect transistor, and the n-type field effect transistor. In subsequent processing steps, the contact level dielectric layer 70 occupies a volume that is equivalent to the combined volumes of the planarization level dielectric layer 60 and the contact level dielectric layer 70.

Figure 15:
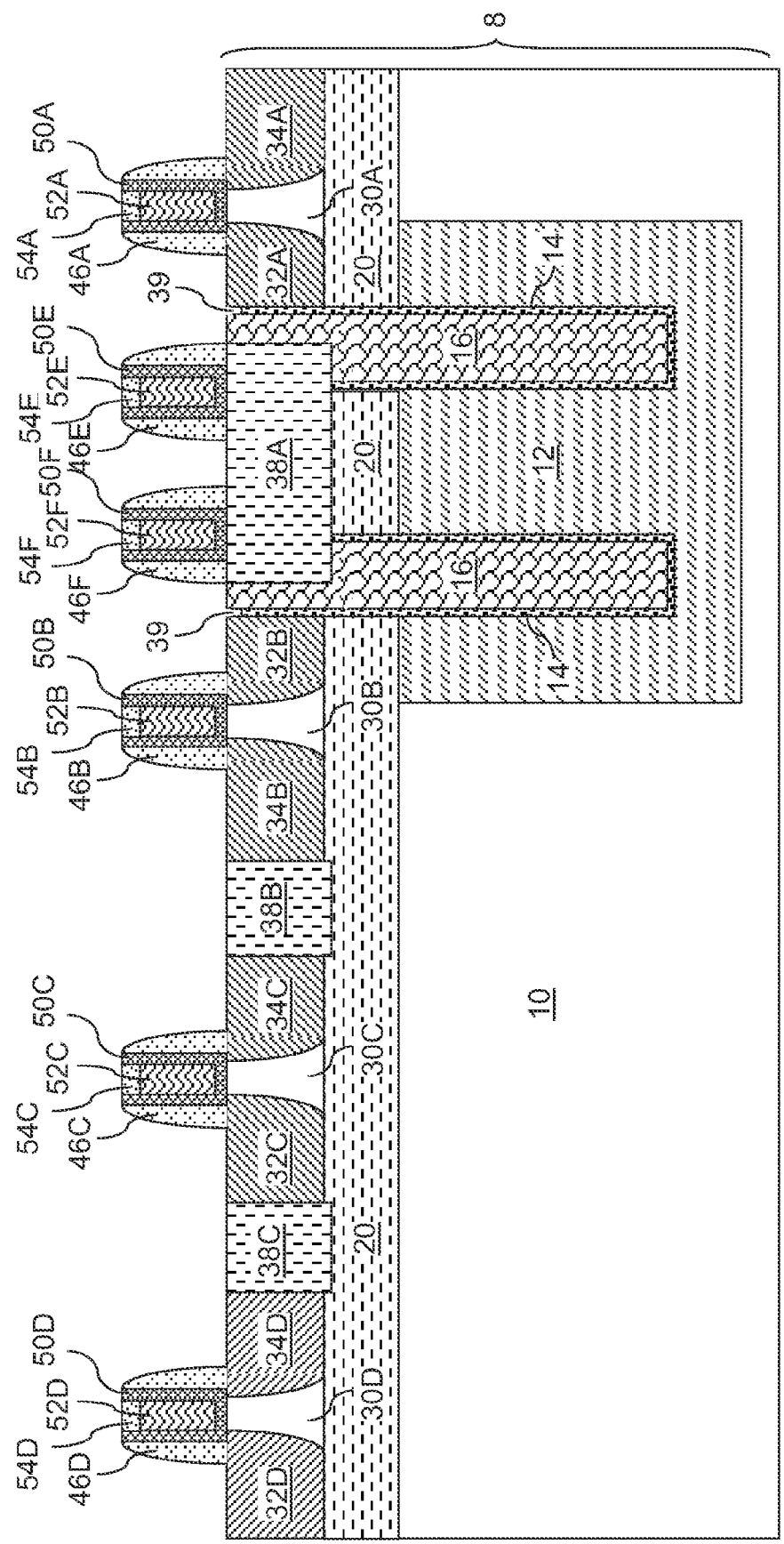
FIG. 15 is a vertical cross-sectional view of a second exemplary semiconductor structure after removal of the planarization dielectric layer according to a second embodiment of the present disclosure.

Referring to FIG. 15, a second exemplary semiconductor structure according to a second embodiment of the present disclosure is derived from the first exemplary semiconductor structure of FIG. by removing the planarization dielectric layer 60 completely after the processing steps of FIG. 7 and before performing the processing steps of FIG. 8. Thus, the planarization dielectric layer 60 is removed from above the inner electrodes 16, the access transistor source regions (32A, 32B), the source regions (32C, 32D) of the p-type field effect transistor and the n-type field effect transistor, and the drain regions (34A, 34B, 34C, 34D) of the access transistor, the p-type field effect transistor, and the n-type field effect transistor.

Figure 16:
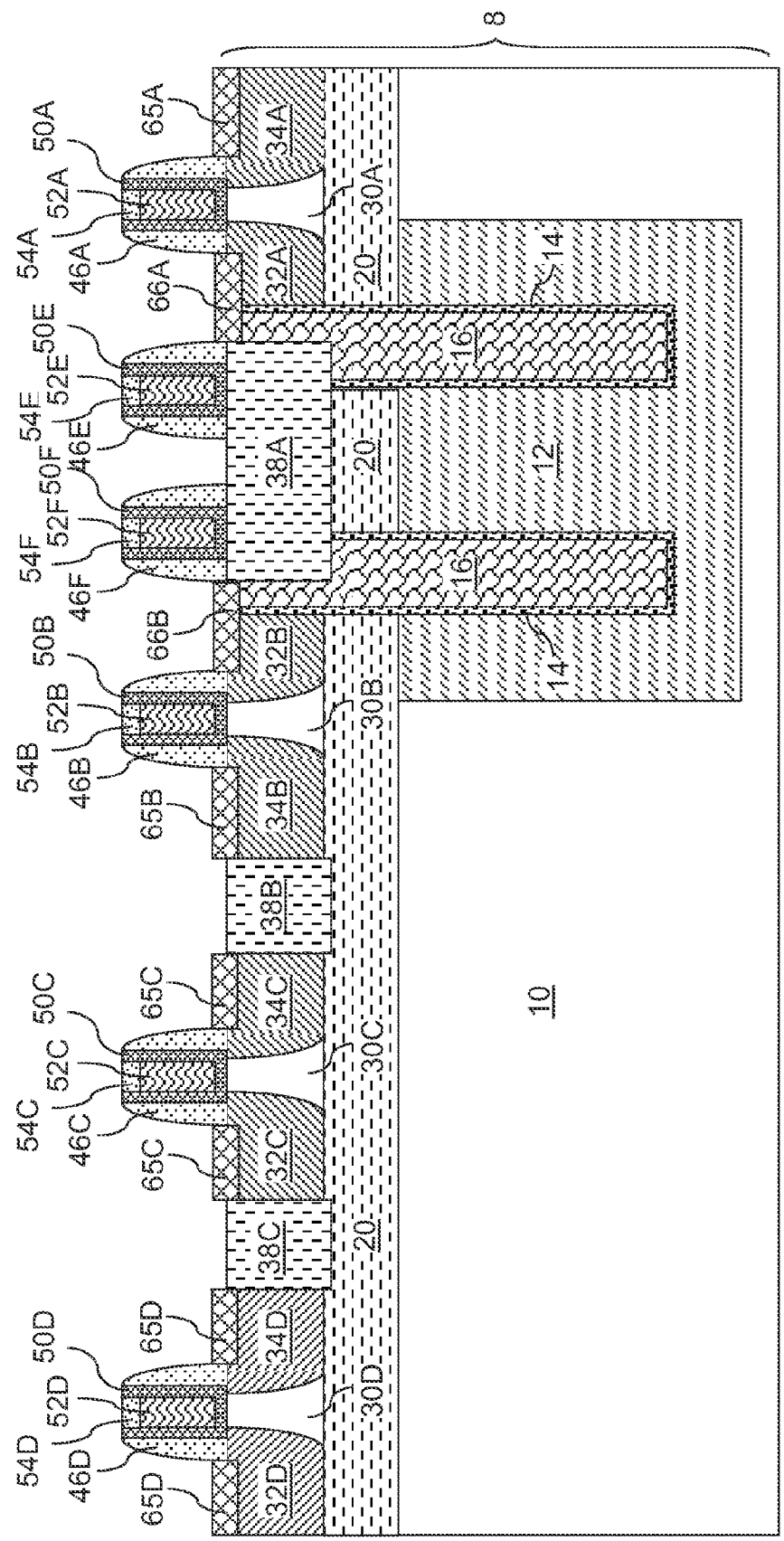
FIG. 16 is a vertical cross-sectional view of the second exemplary semiconductor structure after formation of metal semiconductor alloy portions according to the second embodiment of the present disclosure.

Referring to FIG. 16, various metal semiconductor alloy portions are formed on exposed semiconductor surfaces, for example, by depositing a metal layer (not shown), by annealing the first exemplary semiconductor structure, and by removing unreacted portions of the metal layer. The metal layer includes a metal that can interact with the semiconductor materials of the first access transistor source region 32A, the second access transistor source region 32B, the inner electrodes 16, the first access transistor drain region 34A, the second access transistor drain region 34B, the n-type field effect transistor source region 32C, the n-type field effect transistor drain region 34C, the p-type field effect transistor source region 32D, and the p-type field effect transistor drain region 34D. For example, the metal layer can include Ti, Ta, W, Mo, V, Co, Ni, Pt, or a combination thereof.

The anneal is performed at an elevated temperature at which a reaction between the metal layer and underlying semiconductor material portions occurs. During this reaction, the metal in the metal layer diffuses into the underlying semiconductor material portions and the semiconductor material in the underlying semiconductor material portions diffuse into the metal layer to form the various metal semiconductor alloy portions. The various metal semiconductor alloy portions include a first metal semiconductor alloy portion 66A, a second metal semiconductor alloy portion 66B, third metal semiconductor alloy portions 65C, fourth metal semiconductor alloy portions 65D, a fifth metal semiconductor alloy portion 65A, and a sixth metal semiconductor alloy portion 65B.

The first metal semiconductor alloy portion 66A contacts the first access transistor source region 32A, a node dielectric 14, and an inner electrode 16. The second metal semiconductor alloy portion 66B contacts the second access transistor source region 32B, another node dielectric 14, and another inner electrode 16. The third metal semiconductor alloy portions 65C contact the n-type field effect transistor source region 32C and the n-type field effect transistor drain region 34C. The fourth metal semiconductor alloy portions 65D contact the p-type field effect transistor source region 32D and the p-type field effect transistor drain region 34D. The fifth metal semiconductor alloy portion 65A contacts the first access transistor drain region 34A. The sixth metal semiconductor alloy portion 65B contacts the second access transistor drain region 34B.

Each of the first metal semiconductor alloy portion 66A, the second metal semiconductor alloy portion 66B, the third metal semiconductor alloy portions 65C, the fourth metal semiconductor alloy portions 65D, the fifth metal semiconductor alloy portion 65A, and the sixth metal semiconductor alloy portion 65B laterally contacts a dielectric gate spacer (46A, 46B, 46C, 46D, 46E, or 46F) and a shallow trench isolation structure (38A, 38B, or 38C) because the lateral extent of the each metal semiconductor alloy portion (66A, 66B, 65C, 65D, 65A, 65B) is limited by a dielectric gate spacer (46A, 46B, 46C, 46D, 46E, or 46F) and a shallow trench isolation structure (38A, 38B, or 38C). All of the metal semiconductor alloy portions (66A, 66B, 65C, 65D, 65A, 65B) a same metal, i.e., the metal included in the metal layer for formation of the metal semiconductor alloys.

Figure 17:
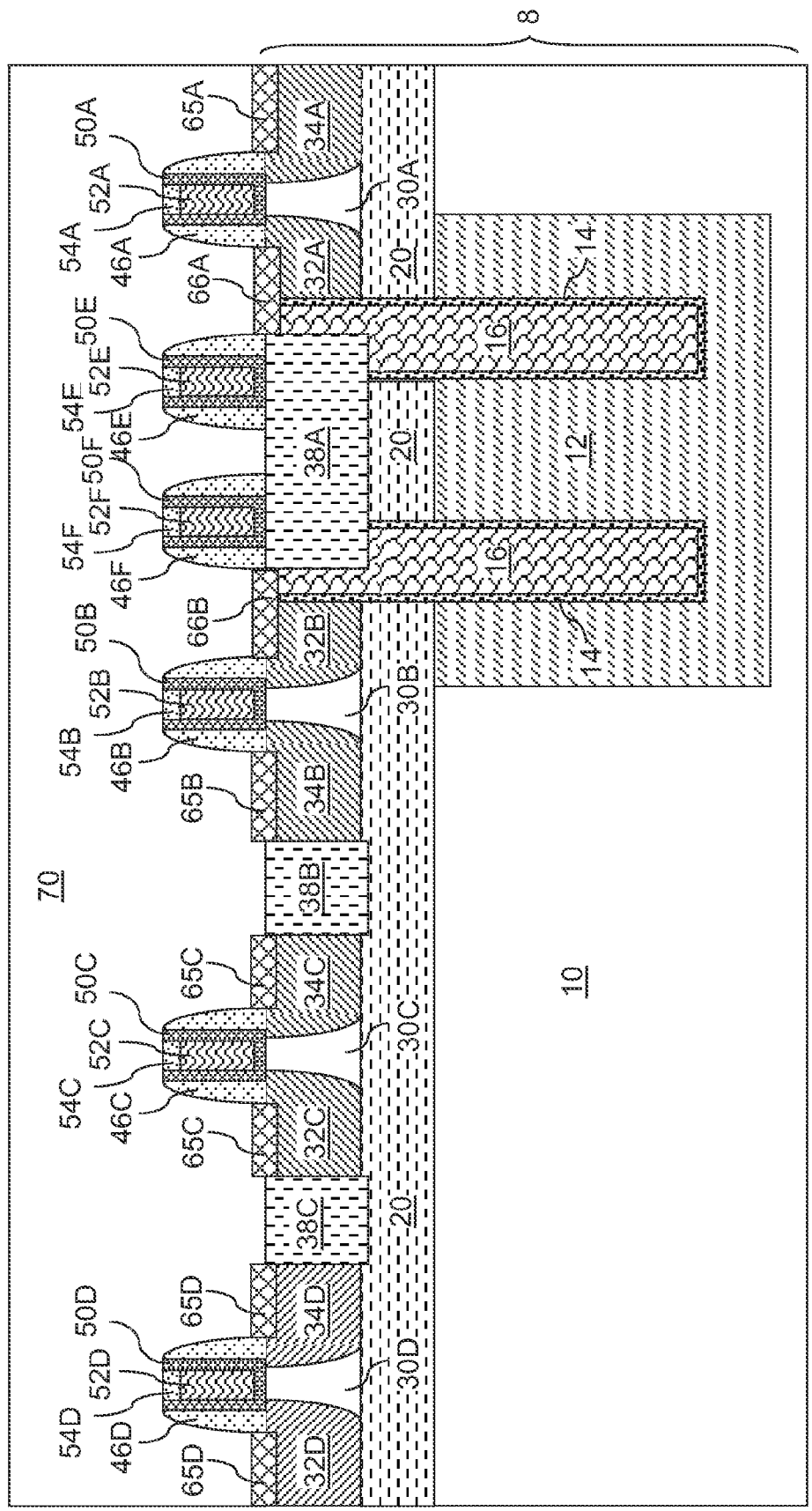
FIG. 17 is a vertical cross-sectional view of the second exemplary semiconductor structure after deposition of a contact level dielectric layer according to the second embodiment of the present disclosure.

Referring to FIG. 17, a contact level dielectric layer 70 is deposited on the various metal semiconductor alloy portions (66A, 66B, 65C, 65D, 65A, 65B), for example, by chemical vapor deposition (CVD). The contact level dielectric layer 70 includes a dielectric material such as silicon oxide, silicon nitride, porous or non-porous organosilicate glass, or a combination thereof. The thickness of the contact level dielectric layer 70 can be from 50 nm to 500 nm, although lesser and greater thicknesses can also be employed. Optionally, the top surface of the contact level dielectric layer 70 may be planarized, for example, by chemical mechanical planarization.

Figure 18:
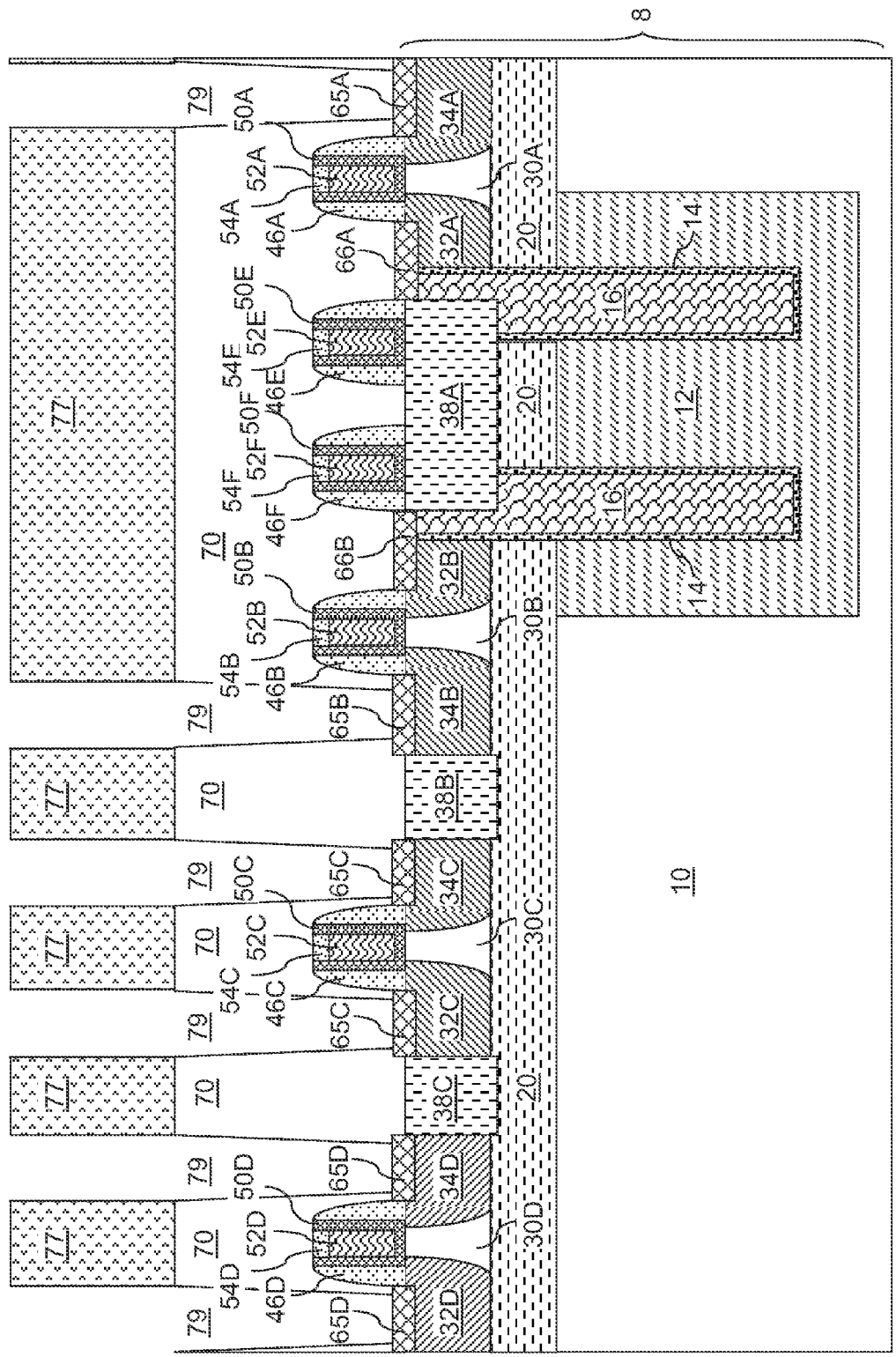
FIG. 18 is a vertical cross-sectional view of the second exemplary semiconductor structure after formation of contact via holes according to the second embodiment of the present disclosure.

Referring to FIG. 18, a second photoresist 77 is applied over the contact level dielectric layer 70 and is lithographically patterned to form openings over areas in which contact via structures are to be formed. Contact via cavities 79 are formed in the contact level dielectric layer 70 by transferring the pattern of the openings in the second photoresist 77 employing an anisotropic etch such as a reactive ion etch so that a metal semiconductor alloy portion (66A, 66B, 65C, 65D, 65A, 65B) is exposed in each of the contact via cavities 79. Specifically, top surfaces of the first access transistor drain region 34A, the second access transistor drain region 34B, the n-type field effect transistor source region 32C, the n-type field effect transistor drain region 34C, the p-type field effect transistor source region 32D, and the p-type field effect transistor drain region 34D. The second photoresist 77 is subsequently removed.

Figure 19:
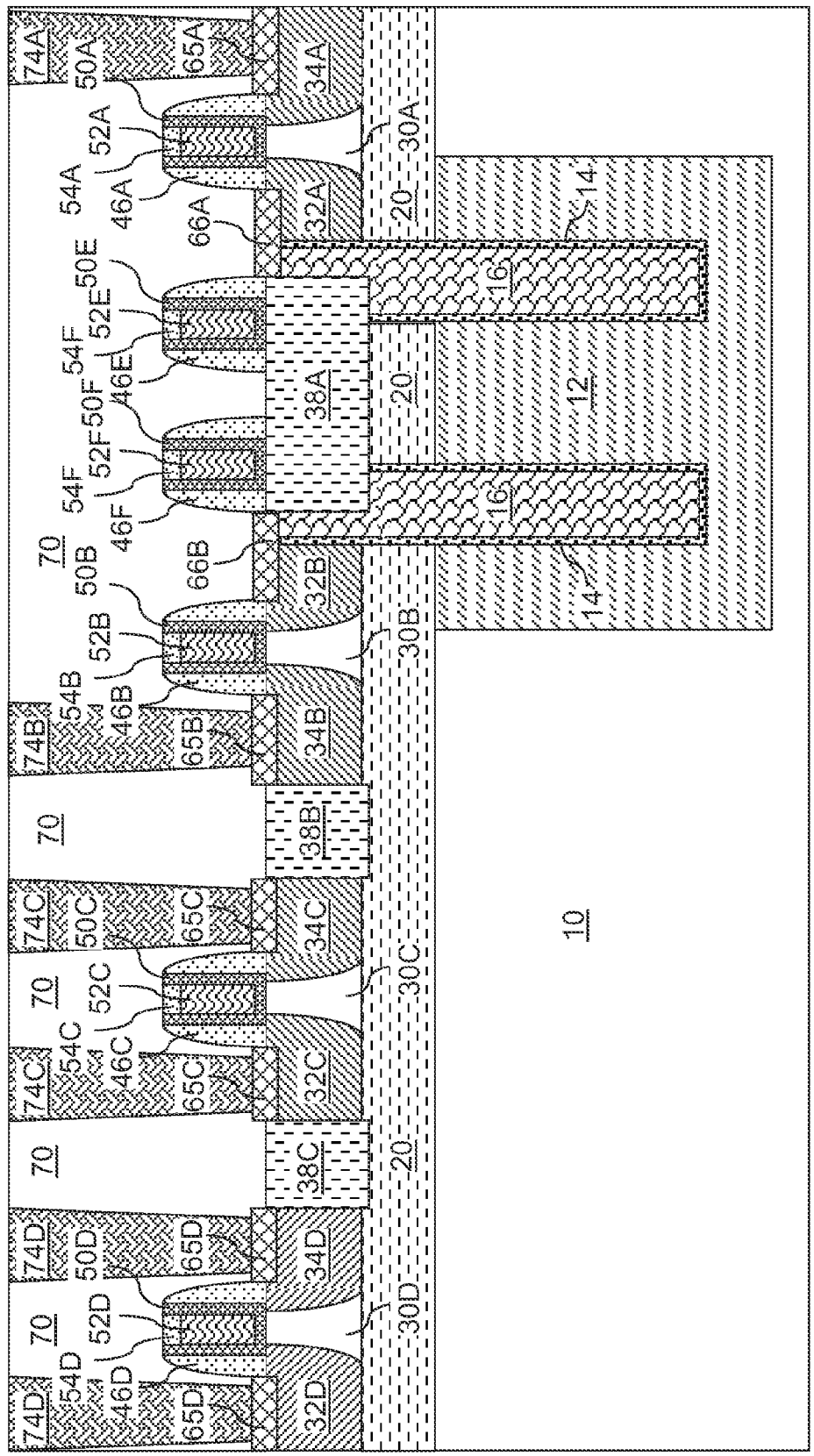
FIG. 19 is a vertical cross-sectional view of the second exemplary semiconductor structure after formation of contact via structures according to the second embodiment of the present disclosure.

Referring to FIG. 19, various contact via structures are formed by deposition of a metal into the contact via cavities 79 and removing excess metal above the top surface of the contact level dielectric layer 70 by planarization. The various contact via structures can include a first contact via structure 74A that contacts a top surface of the fifth metal semiconductor alloy portion 65A, a second contact via structure 74B that contacts a top surface of the sixth metal semiconductor alloy portion 65B, third contact via structures 74C that contact a top surface of the third metal semiconductor alloy portions 65C, and fourth contact via structures 74D that contact a top surface of the fourth metal semiconductor alloy portions 65D. The first metal semiconductor alloy portion 66A and the second metal semiconductor alloy portions 66B are not contacted by any contact via structure because it is not necessary to provide an electrical contact to the inner electrodes 16 or access transistor source regions (32A, 32B).

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
a trench located in a semiconductor substrate;
a node dielectric located on a sidewall of said trench;
an inner electrode comprising a first doped semiconductor material and located within said node dielectric;
an access transistor located on said semiconductor substrate and including an access transistor source region comprising a second doped semiconductor material and contacting said node dielectric;
a metal semiconductor alloy portion contacting said inner electrode, said node dielectric, and said access transistor source region;
a field effect transistor different from said access transistor, located on said semiconductor substrate, and including another dielectric gate spacer, a source region, and a drain region, wherein said source region and said drain region are laterally surrounded by a shallow trench isolation structure; and
at least another metal semiconductor alloy portion located on said source region or said drain region and laterally spaced from at least one of said other dielectric gate spacer and said shallow trench isolation structure.

2. The semiconductor structure of claim 1, wherein said access transistor comprises an access transistor gate structure that includes a gate dielectric, a gate conductor contacting said gate dielectric, a dielectric gate cap contacting a top surface of said gate conductor, and a dielectric gate spacer contacting outer sidewalls of said gate dielectric.

3. The semiconductor structure of claim 2, wherein said gate dielectric contacts an entirety of inner sidewalls of said dielectric gate spacer.

4. The semiconductor structure of claim 2, wherein outer sidewalls of said dielectric gate cap contacts an upper portion of inner sidewalls of said gate dielectric.

5. The semiconductor structure of claim 2, wherein said dielectric gate cap comprises a dielectric metal oxide having a dielectric constant greater than 8.0.

6. The semiconductor structure of claim 1, wherein said metal semiconductor alloy portion and said at least another metal semiconductor alloy portion include different metals.

7. The semiconductor structure of claim 1, further comprising:
a planarization dielectric layer contacting at least one source region or at least one drain region of a field effect transistor; and
a contact level dielectric layer contacting a top surface of said planarization dielectric layer and said metal semiconductor alloy portion.

8. The semiconductor structure of claim 1, further comprising a planarization dielectric layer in contact with sidewalls of said another dielectric gate spacer.

9. The semiconductor structure of claim 8, wherein said planarization dielectric layer is not in contact with said metal semiconductor alloy portion.

10. The semiconductor structure of claim 8, wherein a top surface of said planarization dielectric layer is coplanar with a top surface of said gate dielectric of said access transistor.

11. The semiconductor structure of claim 8, further comprising a contact level dielectric layer contacting a top surface of said planarization dielectric layer.

12. The semiconductor structure of claim 11, wherein said contact level dielectric layer is in contact with said metal semiconductor alloy portion.

13. The semiconductor structure of claim 12, wherein an entirety of a top surface of said metal semiconductor alloy portion is in contact with said contact level dielectric layer.

14. The semiconductor structure of claim 11, wherein said contact level dielectric layer is not in contact with said at least another metal semiconductor alloy portion.

15. The semiconductor structure of claim 11, wherein a bottom surface of said contact level dielectric layer is in contact with a top surface of a gate dielectric of said access transistor.

16. The semiconductor structure of claim 15, wherein a top surface of one of said at least another metal semiconductor alloy portion has a same horizontal cross-sectional area as a bottom surface of said contact via structure.

17. The semiconductor structure of claim 1, further comprising:
a contact level dielectric layer overlying said metal semiconductor alloy portion and said at least one metal semiconductor alloy portion; and
a contact via structure embedded in at least said contact level dielectric layer.

18. The semiconductor structure of claim 1, further comprising a contact level dielectric layer in contact with said metal semiconductor alloy portion and said at least another metal semiconductor alloy portion.

19. The semiconductor structure of claim 18, wherein said gate dielectric of said access transistor laterally surround a dielectric gate cap of said access transistor that overlies said gate conductor of said access transistor.

20. The semiconductor structure of claim 1, wherein a gate dielectric of said access transistor laterally surrounds a gate conductor of said access transistor.

* * * * *